(12) United States Patent
Fujimura et al.

(10) Patent No.: US 7,222,721 B2
(45) Date of Patent: May 29, 2007

(54) TRANSFERRING APPARATUS, CARRYING APPARATUS, AND TRANSFERRING METHOD

(75) Inventors: Hisashi Fujimura, Chino (JP); Shuji Tanaka, Chino (JP); Yoshitake Kobayashi, Shiojiri (JP); Yasutsugu Aoki, Kofu (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/368,061

(22) Filed: Mar. 3, 2006

(65) Prior Publication Data

US 2006/0163037 A1 Jul. 27, 2006

Related U.S. Application Data

(62) Division of application No. 10/798,975, filed on Mar. 11, 2004, now Pat. No. 7,051,863.

(30) Foreign Application Priority Data

Mar. 12, 2003 (JP) ............................. 2003-067296
Dec. 26, 2003 (JP) ............................. 2003-434184

(51) Int. Cl.
*B65G 43/10* (2006.01)
(52) U.S. Cl. ................... 198/575; 198/718; 198/347.1; 198/341.01
(58) Field of Classification Search ............. 198/347.1, 198/347.3, 341.01, 575, 576, 718; 414/935
See application file for complete search history.

(56) References Cited

U.S. PATENT DOCUMENTS

| | | | |
|---|---|---|---|
| 1,402,487 A | 1/1922 | Fooks | |
| 3,870,169 A | 3/1975 | Kojima | |
| 4,554,723 A | 11/1985 | Repella | |
| 4,589,541 A | 5/1986 | Lisec | |
| 5,271,489 A | 12/1993 | Helmstetter | |

(Continued)

FOREIGN PATENT DOCUMENTS

JP 59-179808 U 12/1984

(Continued)

OTHER PUBLICATIONS

Communication from Japanese Patent Office regarding counterpart application.

(Continued)

*Primary Examiner*—James R. Bidwell
(74) *Attorney, Agent, or Firm*—Harness, Dickey & Pierce, P.L.C.

(57) ABSTRACT

A transferring apparatus is provided between a plurality of carrying apparatuses, each carrying apparatus comprising support means for supporting carried products Wf, guide means for controlling the moving direction of the support means, the guide means being provided along processing apparatuses for processing the carried products Wf, and moving means for moving the support means along the guide means. The transferring apparatus includes synchronization control means for synchronizing the moving means of the one carrying apparatus with the moving means of the other carrying apparatus; and at least one hand-over means for receiving the carried products Wf from the support means of the one carrying apparatus and handing over the carried products Wf to the support means of the other carrying apparatus.

31 Claims, 20 Drawing Sheets

U.S. PATENT DOCUMENTS

| | | | |
|---|---|---|---|
| 5,407,449 | A | 4/1995 | Zinger |
| 5,597,156 | A | 1/1997 | Claassen |
| 6,036,426 | A | 3/2000 | Hillman |
| 6,235,634 | B1 | 5/2001 | White et al. |
| 6,425,477 | B1 | 7/2002 | Karasawa |
| 6,478,134 | B2 | 11/2002 | Pattantyus-Abraham et al. |
| 6,571,934 | B1 | 6/2003 | Thompson et al. |

FOREIGN PATENT DOCUMENTS

| | | |
|---|---|---|
| JP | 61-257814 | 11/1986 |
| JP | 01-255509 | 10/1989 |
| JP | 2-29527 | 2/1990 |
| JP | 02-078243 | 3/1990 |
| JP | 02-117512 | 5/1990 |
| JP | 3-154751 | 7/1991 |
| JP | 6-732 | 1/1994 |
| JP | 6-48563 | 2/1994 |
| JP | 06-104332 | 4/1994 |
| JP | 06-310424 | 11/1994 |
| JP | 9-63485 | 3/1997 |
| JP | 2001-233450 | 8/2001 |
| JP | 2001-519598 | 10/2001 |

OTHER PUBLICATIONS

Communication from Japanese Patent Office regarding corresponding application.

TRANSFERRING APPARATUS, CARRYING APPARATUS, AND TRANSFERRING METHOD

CROSS-REFERENCE TO RELATED APPLICATIONS

This application is a divisional patent application of U.S. Ser. No. 10/798,975 filed Mar. 11, 2004 now U.S. Pat. No. 7,051,863, claiming priority to Japanese Patent Application No. 2003-067296 filed Mar. 12, 2003 and 2003-434184 filed Dec. 26, 2003 which are hereby expressly incorporated by reference herein in their entireties.

BACKGROUND

1. Technical Field of the Invention

The present invention relates to a transferring apparatus for transferring a carried product, a carrying apparatus, and a transferring method.

2. Description of the Related Art

Recently, as so-called IT industry has developed, various electronic devices such as semiconductor devices and liquid crystal display devices have been developed. For manufacturing the electronic devices, for example, the semiconductor devices, processing apparatuses for performing processes such as photolithography, film formation, etching and cleaning processes and carrying apparatuses for carrying substrates or substrate wafers between the processing apparatuses are used.

For the carrying apparatus, since it is necessary to prepare a facility capable of obtaining carrying amounts needed to efficiently produce the devices in the manufacturing facility capable of obtaining product amounts corresponding to demands for the devices, various types of carrying apparatuses capable of efficiently performing carrying have been developed. Recently, since the tendency of the production changes from limit-type mass production to wide-type small production, suitable carrying apparatuses have been contrived and methods of carrying the wafers one by one have been proposed. Specifically, the carrying apparatus comprises, for example, a conveyor between processing apparatuses for processing the semiconductor wafers and the length of the conveyor is predetermined to cope with the demands for the semiconductor devices (for example, see Japanese Unexamined Patent Application Publication No. 2001-233450 (see FIG. 1)).

When there arises a need to increase production according to the change of the demands forecast of the semiconductor devices, there is a need to add manufacturing apparatuses for ensuring the production and carrying apparatuses for carrying wafers or substrates between the added manufacturing apparatuses as well as between the existing and added carrying apparatuses. However, the conventional conveyor has a problem in that it cannot be easily added because it is impossible to transfer the semiconductor wafers between the existing and added conveyors.

Accordingly, an object of the present invention is to provide a transferring apparatus, a carrying apparatus, and a transferring method for solving the above problems and facilitating extension of carrying apparatuses.

SUMMARY

The object can be achieved by a first aspect of the present invention, which provides a transferring apparatus provided between a plurality of carrying apparatuses, each carrying apparatus comprising support means for supporting carried products, guide means for controlling the moving direction of the support means, the guide means being provided along a processing apparatus for processing the carried products, and moving means for moving the support means along the guide means, the transferring apparatus comprising: synchronization control means for synchronizing the moving means of one carrying apparatus with the moving means of another carrying apparatus; and at least one hand-over means for receiving the carried products from the support means of the one carrying apparatus and handing over the carried products to the support means of the other carrying apparatus.

According to the construction, when adding a new manufacturing apparatus, if the existing carrying apparatus has an insufficient carrying ability, and the new manufacturing apparatus can not be connected to the existing carrying apparatus, for example, a to-be-added carrying apparatus is installed and, the carried products are transferred by the transferring apparatus between the added and existing carrying apparatuses. Specifically, in the transferring apparatus, moving means of the one carrying apparatus is- synchronized with moving means of the other carrying apparatus and the carried products are received from the support means of the one carrying apparatus and handed over to the support means of the other carrying apparatus by the hand-over means. Accordingly, it suffices to consider a currently needed minimum ability of carrying the carried products when initially providing a carrying apparatus and it is possible to simply install additional carrying apparatuses if later needed.

A second aspect of the present invention provides a transferring apparatus according to the 1st aspect of the present invention, wherein the hand-over means receives some carried products selected among the plurality of carried products which are carried by the one carrying apparatus.

According to the construction, since the carried products which need to be carried only by the one carrying apparatus are not handed over to the other carrying apparatus by the hand-over means, the carried products can be efficiently carried.

A third aspect of the present invention provides a transferring apparatus according to the 1st aspect of the present invention, wherein the hand-over means receives all the carried products which are carried by the one carrying apparatus.

According to the construction, since the hand-over means receives all the carried products from the one carrying apparatus, it is not necessary for the hand-over means to determine whether there is a carried product to receive. As a result, it is possible to easily obtain the timing of handing over the carried products between the carrying apparatuses. For this reason, since the synchronization control means can be easily controlled, it is possible to implement an easily-controlled transferring apparatus.

A fourth aspect of the present invention provides a transferring apparatus according to one of the 1st to 3rd aspects of the present invention, further comprising at least one buffer means for temporarily storing the carried products between the one carrying apparatus and the other carrying apparatus.

According to the construction, even when the carried products received from the support means of the one carrying apparatus are not immediately handed over to the support means of the other carrying apparatus, the carried products can be temporarily stored. As a result, the carried products can be handed over according to the carrying state of the other carrying apparatus.

A fifth aspect of the present invention provides a transferring apparatus according to the fourth aspect of the present invention, wherein the transferring apparatus is integrated with each of the carrying apparatuses.

According to the construction, when adding a new carrying apparatus in order to increase the ability of carrying the carried products, the transferring apparatus that is originally or previously connected to be integrated with the to-be-added carrying apparatus may be connected to the existing carrying apparatus, or only the to-be-added carrying apparatus may be installed, with the transferring apparatus being originally or previously connected to be integrated with the existing carrying apparatus. That is, the transferring apparatus integrated with the carrying apparatuses can carry the carried products between the one and the other carrying apparatuses.

A sixth aspect of the present invention provides a transferring apparatus according to the fifth aspect of the present invention, wherein each of the carried products is a substrate wafer.

A seventh aspect of the present invention provides a transferring apparatus according to the sixth aspect of the present invention, wherein the substrate wafer is a semiconductor wafer.

An eighth aspect of the present invention provides a transferring apparatus according to the fifth aspect of the present invention, wherein each of the carried products is an electronic device manufacturing substrate.

A ninth aspect of the present invention provides a transferring apparatus according to the eighth aspect of the present invention, wherein the electronic device manufacturing substrate is a liquid crystal device substrate.

A tenth aspect of the present invention provides a transferring apparatus according to the eighth aspect of the present invention, wherein the electronic device manufacturing substrate is a quartz device substrate.

An eleventh aspect of the present invention provides a transferring apparatus according to the fourth aspect of the present invention, wherein each of the buffer means is provided in combination with each, of the hand-over means.

According to the construction, since the buffer means is provided for every hand-over means, the hand-over means can be easily controlled.

A twelfth aspect of the present invention provides a transferring apparatus according to the fourth aspect of the present invention, wherein the buffer means is shared by the plurality of the hand-over means.

According to the construction, since the number of buffer means is small, it is possible to provide an easily-controlled low-cost transferring apparatus.

A thirteenth aspect of the present invention provides a transferring apparatus according to the first, second, eleventh, or twelfth aspect of the present invention, wherein each of the carried products is a substrate wafer.

A fourteenth aspect of the present invention provides a transferring apparatus according to the thirteenth aspect of the present invention, wherein the substrate wafer is a semiconductor wafer.

A fifteenth aspect of the present invention provides a transferring apparatus according to the first, second, eleventh, or twelfth aspect of the present invention, wherein each of the carried products is an electronic device manufacturing substrate.

A sixteenth aspect of the present invention provides a transferring apparatus according to the fifteenth aspect of the present invention, wherein the electronic device manufacturing substrate is a liquid crystal device substrate.

A seventeenth aspect of the present invention provides a transferring apparatus according to the fifteenth aspect of the present invention, wherein the electronic device manufacturing substrate is a quartz device substrate.

An eighteenth aspect of the present invention provides a transferring apparatus according to the first, second, eleventh, or twelfth aspect of the present invention, wherein the transferring apparatus is integrated with each of the carrying apparatuses.

According to the construction, when adding a new carrying apparatus in order to increase the ability of carrying the carried products, the transferring apparatus that is originally or previously connected to be integrated with the to-be-added carrying apparatus may be connected to the existing carrying apparatus, or only the to-be-added carrying apparatus may be installed, with the transferring apparatus being originally or previously connected to be integrated with the existing carrying apparatus. That is, the transferring apparatus integrated with the carrying apparatuses can carry the carried products between the one and the other carrying apparatuses.

A nineteenth aspect of the present invention provides a transferring apparatus according to the eighteenth aspect of the present invention, wherein each of the carried products is a substrate wafer.

A twentieth aspect of the present invention provides a transferring apparatus according to the nineteenth aspect of the present invention, wherein the substrate wafer is a semiconductor wafer.

A twenty-first aspect of the present invention provides a transferring apparatus according to the eighteenth aspect of the present invention, wherein each of the carried products is an electronic device manufacturing substrate.

A twenty-second aspect of the present invention provides a transferring apparatus according to the twenty-first aspect of the present invention, wherein the electronic device manufacturing substrate is a liquid crystal device substrate.

A twenty-third aspect of the present invention provides a transferring apparatus according to the twenty-first aspect of the present invention, wherein the electronic device manufacturing substrate is a quartz device substrate.

The object can be achieved by a twenty-fourth aspect of the present invention, which provides a carrying apparatus comprising: a plurality of carrying means, each carrying means comprising support means for supporting carried products, guide means for controlling the moving direction of the support means, the guide means being provided along a processing apparatus for processing the carried products, and moving means for moving the support means along the guide means; and transferring means being provided between the plurality of carrying means, wherein the transferring means comprises: synchronization control means for synchronizing the moving means of one carrying means with the moving means of another carrying means; and at least one hand-over means for receiving the carried products from the support means of the one carrying means and handing over the carried products to the support means of the other carrying means.

According to the construction, when adding a new manufacturing apparatus, if the existing carrying means has an insufficient carrying ability, and the manufacturing apparatus can not be connected to the existing carrying means for example, it suffices that the to-be-added carrying apparatus is installed and, the carried products are transferred by the transferring apparatus between the added carrying means and the existing carrying means. Specifically, in the transferring apparatus, moving means of one carrying means is synchronized with moving means of another carrying means and the carried products are received from the support means of the one carrying apparatus and handed over to the support means of the other carrying means by the hand-over means. Accordingly, it is sufficient to consider a currently needed minimum ability of carrying the carried products at the time of initially providing carrying means and it is possible to simply install additional carrying means if later needed.

A twenty-fifth aspect of the present invention provides a carrying apparatus according to the twenty-fourth aspect of the present invention, wherein the hand-over means receives some carried products selected among the plurality of the carried products which are carried by the one carrying means.

According to the construction, since the carried products which need to be carried only by the one carrying means are not handed over to the other carrying means by the hand-over means, the carried products can be efficiently carried.

A twenty-sixth aspect of the present invention provides a carrying apparatus according to the twenty-fourth aspect of the present invention, wherein the hand-over means receives all the carried products which are carried by the one carrying means.

According to the construction, since the hand-over means receives all the carried products from-the one carrying means, it is not necessary for the hand-over means to determine whether there is a carried product to receive. As a result, it is possible to easily obtain the timing of handing over the carried products between the carrying means. For this reason, since the synchronization control means can be easily controlled, it is possible to implement an easily-controlled carrying apparatus.

A twenty-seventh aspect of the present invention provides a carrying apparatus according to one of the twenty-fourth to twenty-sixth aspects of the present invention, further comprising at least one buffer means for temporarily storing the carried products between the one carrying means and the other carrying means.

According to the construction, even when the carried products received from the support means of the one carrying means cannot be immediately handed over to the support means of the other carrying means, the carried products can be temporarily stored. As a result, the carried products can be handed over according to the carrying state of the other carrying means.

A twenty-eighth aspect of the present invention provides a carrying apparatus according to the twenty-seventh aspect of the present invention, wherein the transferring means is integrated with each of the carrying means.

According to the construction, when adding a new carrying means in order to increase the ability of carrying the carried products, the transferring apparatus that is originally or previously connected to be integrated with the to-be-added carrying means may be connected to the existing carrying means, or only the to-be-added carrying means may be installed, with the transferring apparatus being originally or previously connected to be integrated with the existing carrying means. That is, the transferring apparatus integrated with the carrying means can carry the carried products between the one and other carrying means.

A twenty-ninth aspect of the present invention provides a carrying apparatus according to the twenty-eighth aspect of the present invention, wherein each of the carried products is a substrate wafer.

A thirtieth aspect of the present invention provides a carrying apparatus according to the twenty-ninth aspect of the present invention, wherein the substrate wafer is a semiconductor wafer.

A thirty-first aspect of the present invention provides a carrying apparatus according to the twenty-eighth aspect of the present invention, wherein each of the carried products is an electronic device manufacturing substrate.

A thirty-second aspect of the present invention provides a carrying apparatus according to the thirty-first aspect of the present invention, wherein the electronic device manufacturing substrate is a liquid crystal device substrate.

The thirty-third aspect of the present invention provides a carrying apparatus according to the thirty-first aspect of the present invention, wherein the electronic device manufacturing substrate is a quartz device substrate.

A thirty-fourth aspect of the present invention provides a carrying apparatus according to the twenty-seventh aspect of the present invention, wherein each of the buffer means is provided in combination with each of the hand-over means.

According to the construction, since the buffer means is provided for every hand-over means, the hand-over means can be easily controlled.

A thirty-fifth aspect of the present invention provides a carrying apparatus according to the twenty-seventh aspect of the present invention, wherein the buffer means is shared by the plurality of the hand-over means.

According to the construction, since the number of buffer means is small, it is possible to provide an easily-controlled, low-cost transferring apparatus.

A thirty-sixth aspect of the present invention provides a carrying apparatus according to the twenty-fourth, twenty-fifth, thirty-fourth, or thirty-fifth aspect of the present invention, wherein each of the carried products is a substrate wafer.

A thirty-seventh aspect of the present invention provides a carrying apparatus according to the thirty-sixth aspect of the present invention, wherein the substrate wafer is a semiconductor wafer.

A thirty-eighth aspect of the present invention provides a carrying apparatus according to the twenty-fourth, twenty-fifth, thirty-fourth, or thirty-fifth aspect of the present invention, wherein each of the carried products is an electronic device manufacturing substrate.

A thirty-ninth aspect of the present invention provides a carrying apparatus according to the thirty-eighth aspect of the present invention, wherein the electronic device manufacturing substrate is a liquid crystal device substrate.

A fortieth aspect of the present invention provides a carrying apparatus according to the thirty-eighth aspect of the present invention, wherein the electronic device manufacturing substrate is a quartz device substrate.

A forty-first aspect of the present invention provides a carrying apparatus according to the twenty-fourth, twenty-fifth, thirty-fourth, or thirty-fifth aspect of the present invention, wherein the transferring means is integrated with each of the carrying means.

According to the construction, when adding a new carrying means in order to increase the ability of carrying the carried products, the transferring apparatus that is originally or previously connected to be integrated with the to-be-added carrying means may be connected to the existing carrying means, or only the to-be-added carrying means may be installed, with the transferring apparatus being originally or previously connected to be integrated with the existing carrying means. That is, the transferring apparatus integrated with the carrying means can carry the carried products between the one carrying means and the other carrying means.

A forty-second aspect of the present invention provides a carrying apparatus according to the forty-first aspect of the present invention, wherein each of the carried products is a substrate wafer.

A forty-third aspect of the present invention provides a carrying apparatus according to the forty-second aspect of the present invention, wherein the substrate wafer is a semiconductor wafer.

A forty-fourth aspect of the present invention provides a carrying apparatus according to the forty-first aspect of the present invention, wherein each of the carried products is an electronic device manufacturing substrate.

A forty-fifth aspect of the present invention provides a carrying apparatus according to the forty-fourth aspect of the present invention, wherein the electronic device manufacturing substrate is a liquid crystal device substrate.

A forty-sixth aspect of the present invention provides a carrying apparatus according to the forty-fourth aspect of the present invention, wherein the electronic device manufacturing substrate is a quartz device substrate.

The object can be achieved by a forty-seventh aspect of the present invention, which provides a transferring method being performed between a plurality of carrying apparatuses, each carrying apparatus comprising support means for supporting carried products, guide means for controlling the moving direction of the support means, the guide means being provided along processing apparatus for processing the carried products, and moving means for moving the support means along the guide means, wherein, while the moving means of one carrying apparatus is synchronized with the moving means of another carrying apparatus, the carried products are received from the support means of the one carrying apparatus and handed over to the support means of the other carrying apparatus.

BRIEF DESCRIPTION OF THE DRAWINGS

FIG. 7 is a perspective view illustrating an example of a construction of a transferring unit and the like.

FIG. 8 is a perspective view illustrating an example of a construction of a transferring unit and the like.

FIG. 9 is a perspective view illustrating an example of a construction of a transferring unit and the like.

FIG. 10 is a perspective view illustrating an example of a construction of a transferring unit and the like.

FIG. 11 is a perspective view illustrating an example of a construction of a transferring unit and the like.

FIG. 12 is a perspective view illustrating an example of a detailed construction of a transferring unit and the like.

FIG. 13 is a perspective view illustrating an example of a detailed construction of a transferring unit and the like.

FIG. 15 is a perspective view illustrating an example of an operational state of a transferring unit and the like.

FIG. 16 is a perspective view illustrating an example of an operational state of a transferring unit and the like.

FIG. 17 is a perspective view illustrating an example of an operational state of a transferring unit and the like.

FIG. 18 is a perspective view illustrating an example of an operational state of a transferring unit and the like.

FIG. 19 is a perspective view illustrating an example of an operational state of a transferring unit and the like.

FIG. 20 is a perspective view illustrating an example of an operational state of a transferring unit and the like.

DETAILED DESCRIPTION

Now, the preferred embodiments of the present invention will be described with reference to the accompanying drawings.

Since the following described embodiments are only the exemplary of the present invention, the technically preferred limitation is added to the embodiments. However, the scope of the present invention is not limited thereto.

First Embodiment

Figure 1:
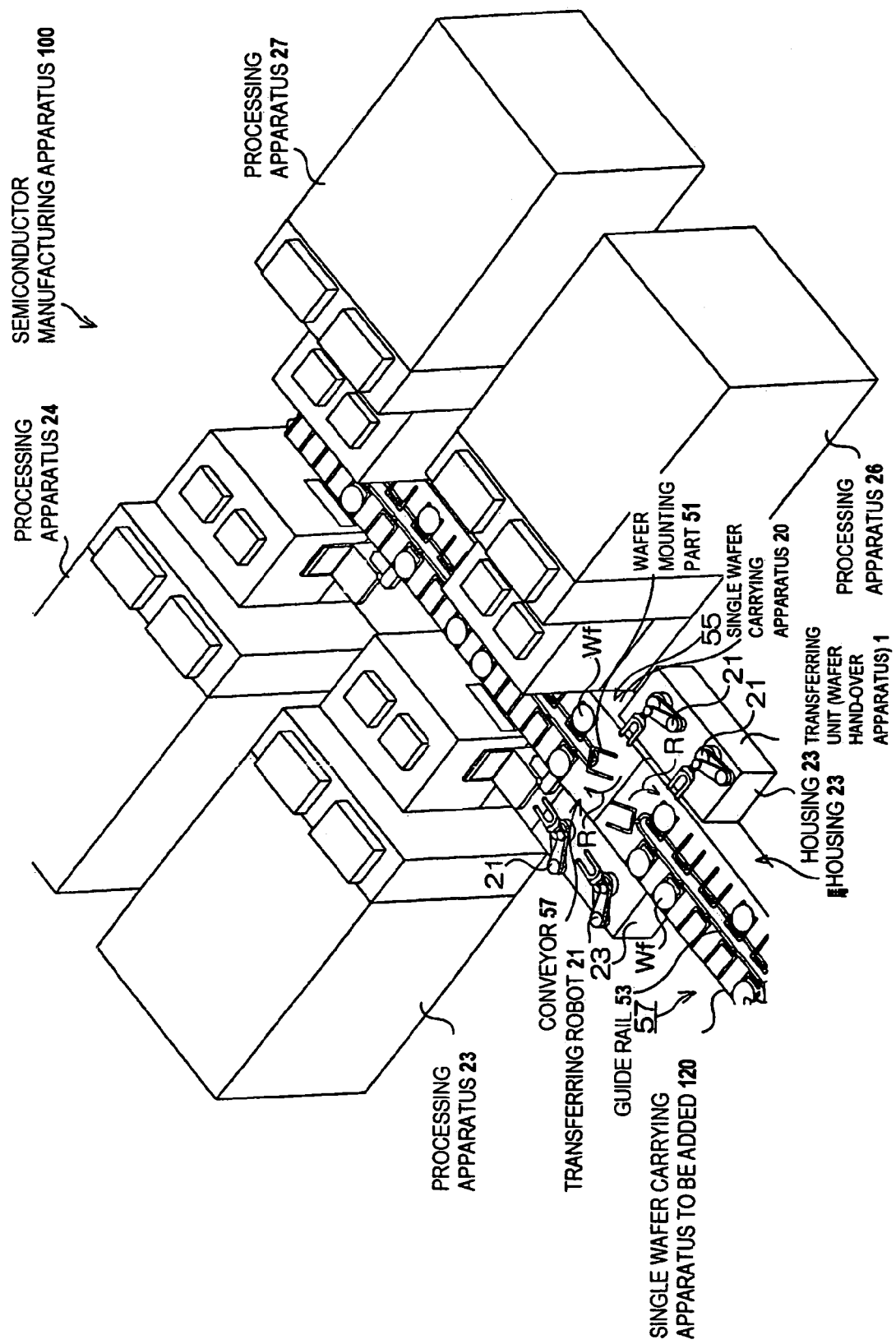
FIG. 1 is a perspective view illustrating an example of an external view of a semiconductor manufacturing apparatus comprising a transferring unit.

FIG. 1 is a perspective view illustrating an example of an external view of a semiconductor manufacturing apparatus 100 including a transferring unit 1 to which a transferring apparatus as a first embodiment of the present invention is adapted. In FIG. 1 and the following figures, a clean tunnel for increasing cleanliness around semiconductor wafers Wf is omitted. The semiconductor wafer is an example of products which are carried between processing apparatuses 23 and the like, and referred to as a wafer in the following embodiments. It is understood that the carried product is not limited to the wafer but may be, among others, a substrate wafer or an electronic device manufacturing substrate.

The semiconductor manufacturing apparatus 100 of FIG. 1 comprises processing apparatuses 23 to 27 and a single wafer carrying apparatus 20 and has a construction capable of adding another single wafer carrying apparatus 120. Each of the single wafer carrying apparatuses 20 and 120 comprises a cover and a cleaning device (not shown in the drawing), so that the ambient of a region through which the wafers Wf pass can be isolated from the external ambient and maintained to be clean. The construction of the single wafer carrying apparatus 120 is the same as that of the single wafer carrying apparatus 20, and description thereof is omitted.

One of the characteristics of the embodiment is that the semiconductor manufacturing apparatus 100 uses transferring units 1 at the time of adding the single wafer carrying apparatus 120. The transferring units 1 are provided, for example, near both sides of a connection portion of the single wafer carrying apparatuses 20 and 120. It is noted that the transferring unit 1 may be provided on only one side rather than on both sides of the connection portion.

Since each transferring unit 1 comprises a cover and a cleaning device (not shown), the ambient of a region through which the wafers Wf pass can be isolated from the external ambient and maintained clean. In, addition, it is preferable that the transferring units 1 be connected to a to-be-added single wafer carrying apparatus 20, for example, in advance. Each transferring unit 1 has a function of reading out an ID (Identification) provided for each wafer Wf in order to identify the wafer Wf. Each transferring unit 1 may be provided with an orientator for aligning a notch or mark of the wafer Wf. The transferring units 1 will be described in detail later.

Each of the processing apparatuses 23 to 27 processes the wafers Wf and forms circuits on the wafer Wf. The wafers Wf are carried, for example, wafer-by-wafer between the processing apparatuses 23 to 27 by the single wafer carrying apparatus. 20. Hereinafter, the method of carrying the carried products such as wafers Wf wafer-by-wafer is referred to as a single wafer carrying method. By carrying the wafers Wf wafer-by-wafer by the single wafer carrying apparatus 20, a process-waiting time hardly occurs in each of the processing apparatuses 23 to 27, so that TAT (Turn Around Time) can be reduced.

The single wafer carrying apparatus 20 comprises a conveyor 57 for carrying the wafers Wf as the carried products in the R direction in the single wafer carrying manner. The conveyor 57 comprises wafer mounting parts 51, a guide rail 53 and a driving unit 55. The wafer mounting parts 51 are supporting means for supporting the wafers Wf. The guide rail 53 is provided along the processing apparatuses 23 to 27 for processing the wafers Wf, as guide means for controlling moving directions of the wafer mounting parts 51. The driving unit 55 is means for moving the wafer mounting parts 51 along the guide rail 53.

Figure 2:
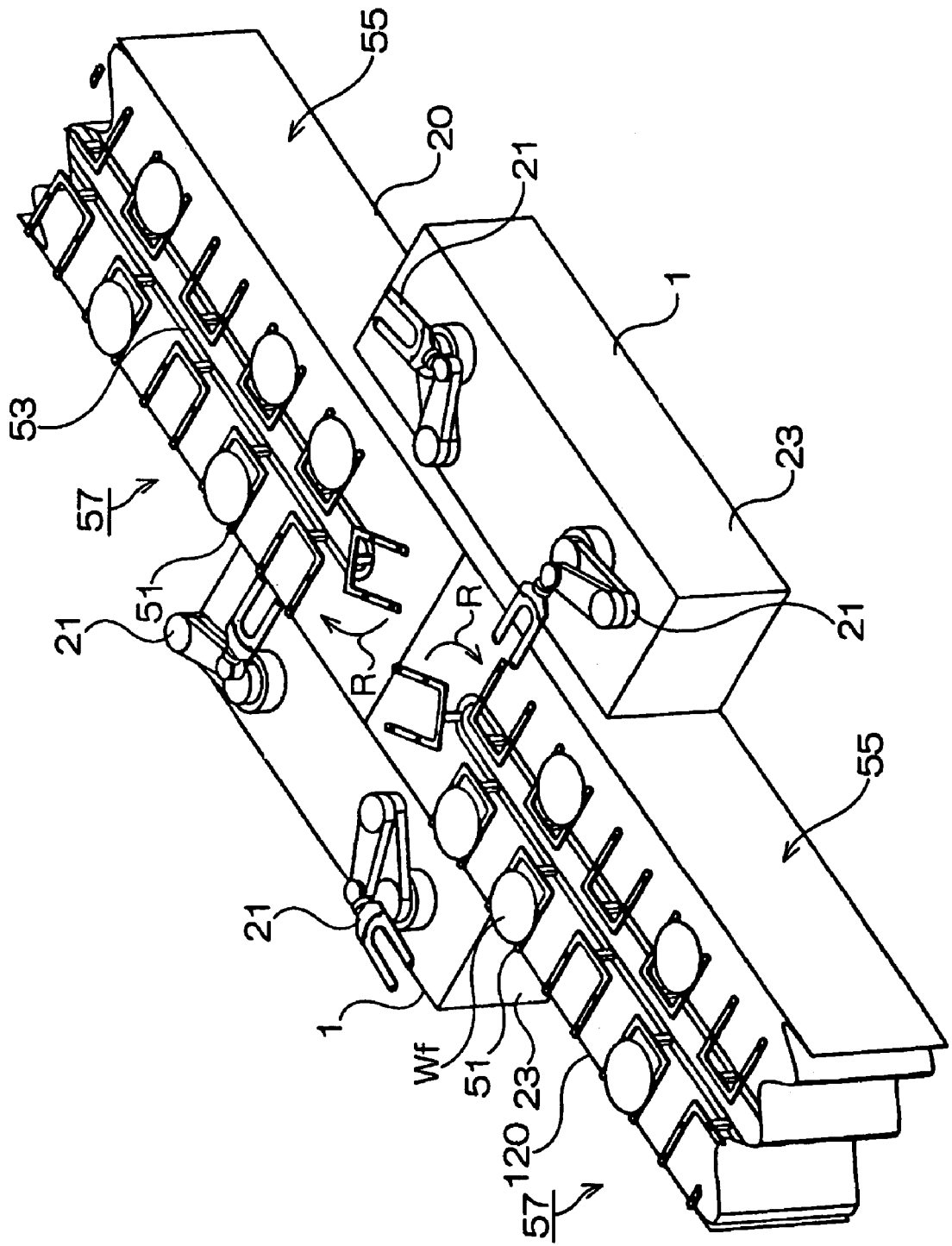
FIG. 2 is a perspective view illustrating an example of a detailed construction including the transferring unit of FIG. 1.
Figure 3:
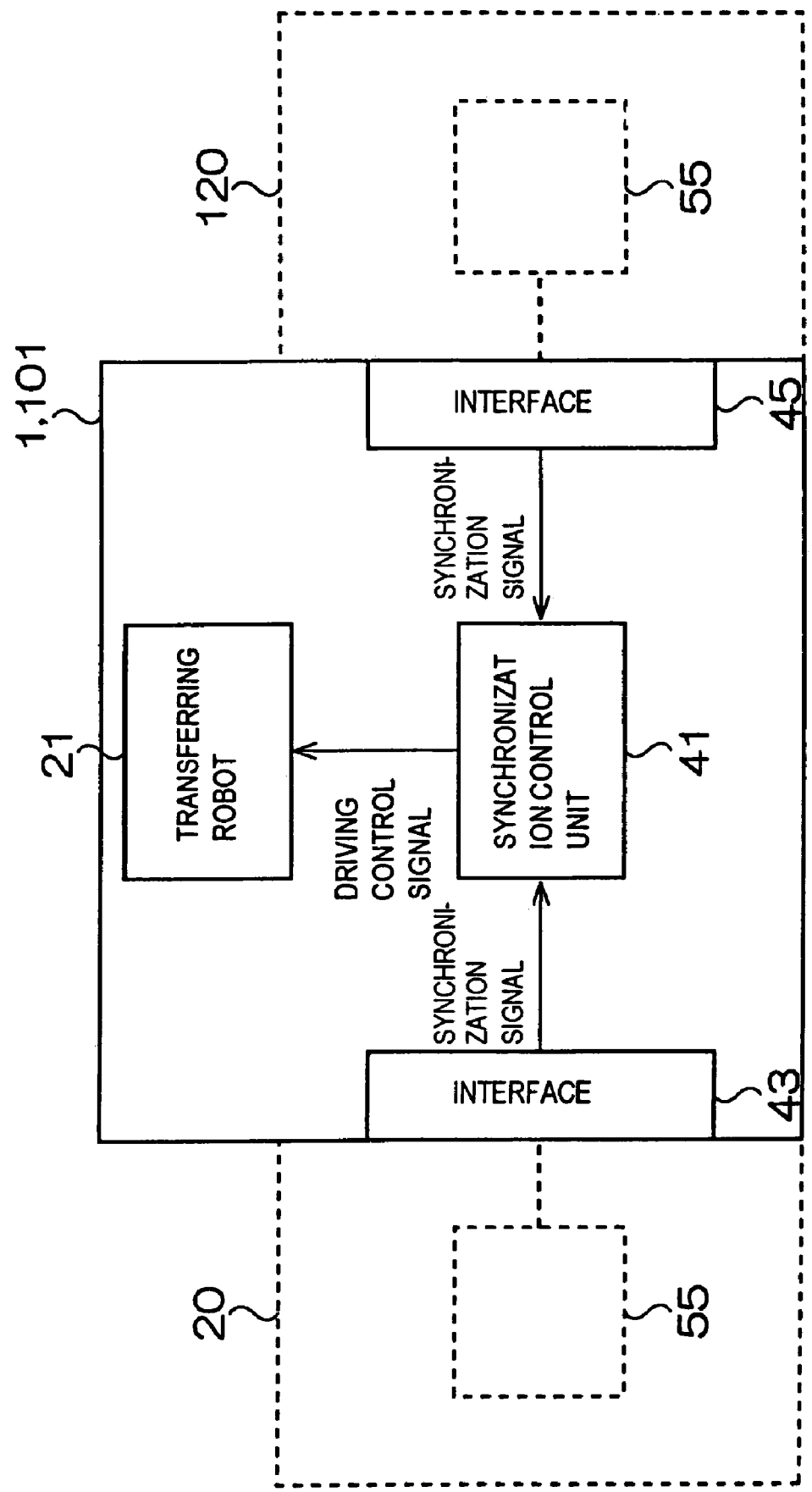
FIG. 3 is a block diagram illustrating an example of an electrical construction of the transferring unit of FIG. 2.

FIG. 2 is a perspective view illustrating an example of the detailed construction of the single wafer carrying apparatuses 20 and 120 and the transferring unit 1 of FIG. 1. FIG. 3 is a block diagram illustrating an example of the electrical construction of the transferring unit 1 of FIG. 2. In FIG. 2, the processing apparatuses 23 to 27 of FIG. 1 are omitted.

As shown in FIG. 2, the transferring unit 1 comprises a case 23 and transferring robots 21 provided on the top of the case 23. At least one transferring robot 21 is provided. Each of the transferring robots is means for receiving a wafer Wf from the wafer mounting parts 51 of the one single wafer carrying apparatus 20 and handing over the wafer Wf to the wafer mounting parts 51 of the other single wafer carrying apparatus 120. It is understood that the transferring unit 1 may be constructed to hand over the wafers Wf in the direction from the single wafer carrying apparatus 120 to the single wafer carrying apparatus 20 or in the bi-directions. The transferring unit 1 may be constructed to hand over all or some of the wafers Wf from the one carrying apparatus 20 to the other carrying apparatus 120 by the wafer mounting parts 51.

In addition to the transferring robots 21, the transferring unit 1 further comprises interfaces 43 and 45 and a synchronization control unit 41, as shown FIG. 3. The interfaces 43 and 45 are means for being electrically connected to other interfaces (not shown) provided to the single wafer carrying apparatuses 20 and 120, respectively. The interfaces 43 and 45 have a function of exchanging synchronization signals to be synchronized with the driving units 55 of the single wafer carrying apparatuses 20 and 120, respectively.

The interfaces 43 and 45 are electrically connected to the synchronization unit 41, respectively. The synchronization unit 41 is connected to the transferring robots 21. The synchronization unit is synchronization control means for synchronizing the driving unit 55 of the one single wafer carrying apparatus 20 with the driving unit 55 of the other added single wafer carrying apparatus 120. Specifically, the synchronization unit 41 applies driving control signals to the transferring robots 21 while synchronizing the single wafer carrying apparatuses 20 and 120.

Figure 4:
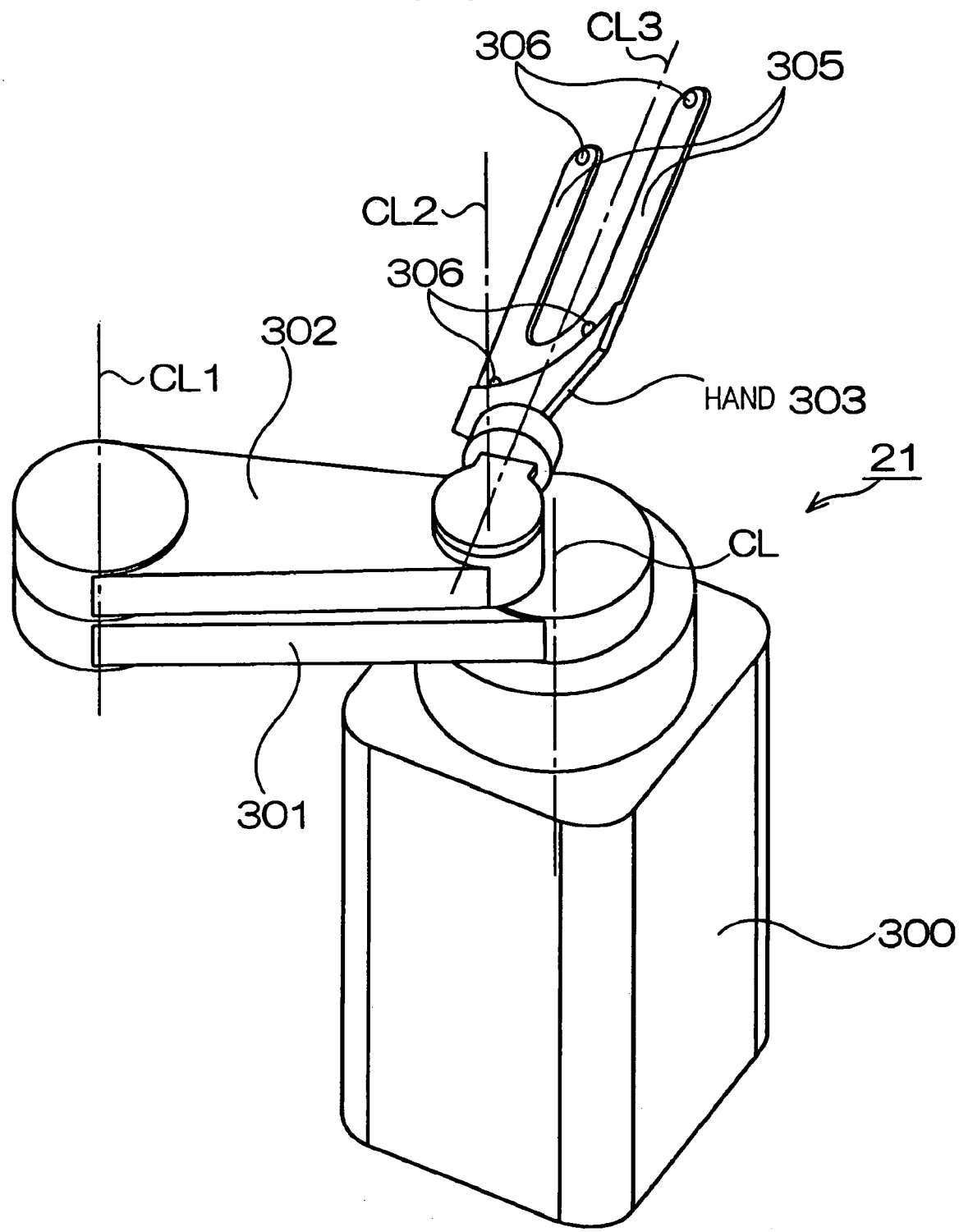
FIG. 4 is a perspective view illustrating an example of an external view of a transferring robot of FIG. 1 or 2.
Figure 5:
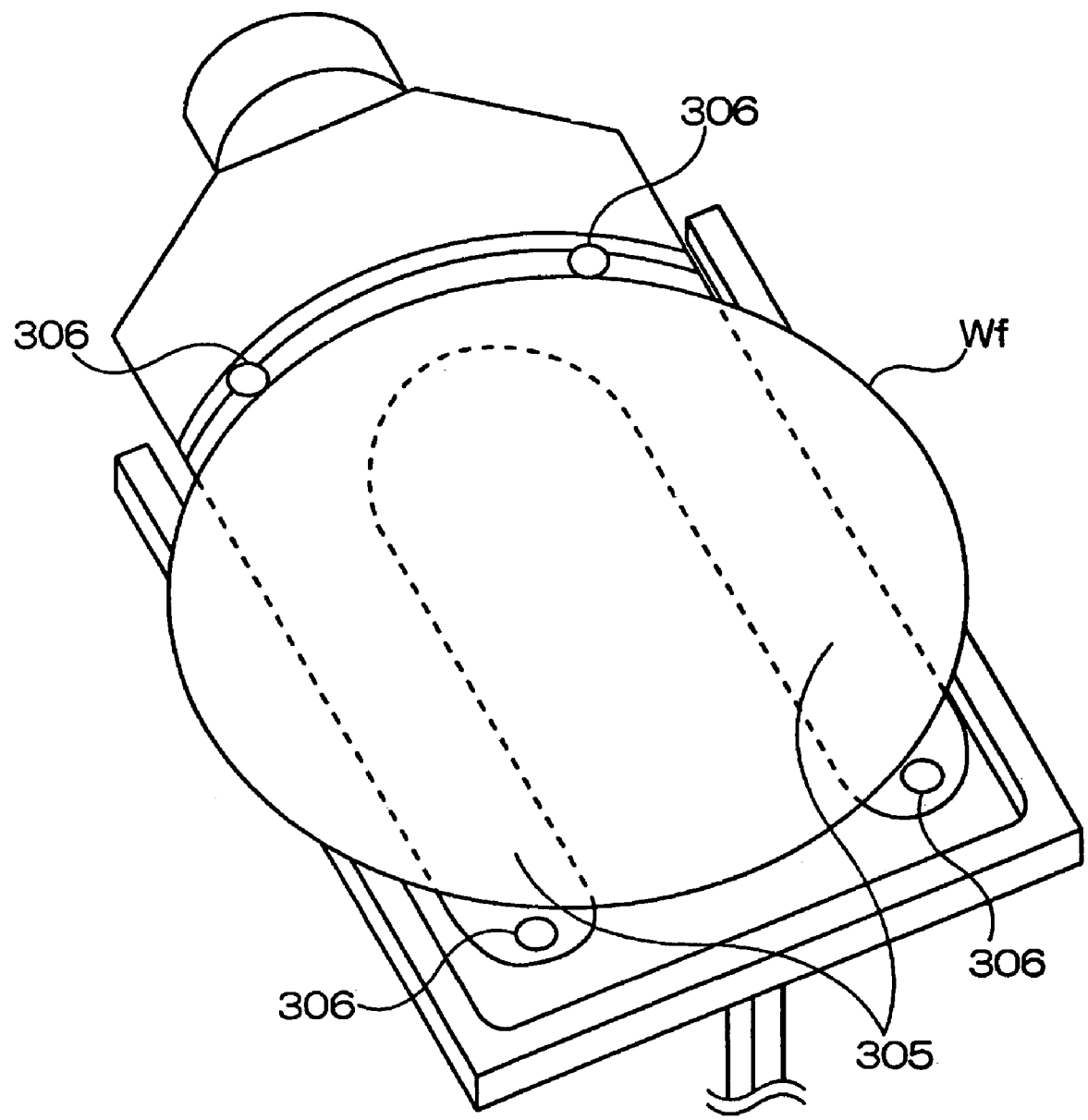
FIG. 5 is a perspective view illustrating an example of a state in which a wafer is scooped.

FIG. 4 is a perspective view illustrating an example of an external view of the transferring robots 21 of FIG. 1 or 2. FIG. 5 is a perspective view illustrating a state in which the wafer Wf is scooped with a hand 303 shown in FIG. 4.

Each transferring robot 21 of FIG. 4 comprises a main body 300, a first arm 301, a second arm 302, and the hand 303. The first arm 301 is rotatable around a central axis CL of the main body 300. The second arm 302 is rotatable around a rotary axis CL1 of the first arm 301. The hand 303 is rotatable around a rotary axis CL2 as well as a rotary axis CL3.

As shown in FIG. 5, the hand 303 has almost U-shaped arm portions 305 and 305. The arm portions 305 and 305 have holding portions 306 for holding an outer circumferential edge surface of a wafer Wf. In addition, each of the transferring robots 21 of FIG. 4 may have one hand 303 (a single hand), two hands 303 (double hands), or three or more hands 303.

Up to now, the construction including the transferring unit 1 has been described. Next, an example of a state in which the wafers Wf are transferred in case of the single wafer carrying apparatus 120 being added to the single wafer carrying apparatus 20 will be described with reference to FIGS. 1 to 4.

Firstly, as shown in FIG. 1, the semiconductor manufacturing apparatus 100 comprises the single wafer carrying apparatus 20 between the processing apparatuses 23 and 24 and the processing apparatuses 26 and 27. That is, the single wafer carrying apparatus 20 has a function of carrying the wafers Wf processed by the processing apparatuses 23 to 27 in the single wafer carrying manner in an R direction on the conveyor 57.

The single wafer carrying apparatus 20 is typically an apparatus provided depending on demands for semiconductor devices, for example. In the below description, it is assumed that demands for the semiconductor devices are increased and new processing apparatuses (not shown) and the single wafer carrying apparatus 120 are to be added. Since the to-be-added single wafer carrying apparatus 120 and the existing single wafer carrying apparatus 20 independently have their own single wafer carrying functions, a simple connection therebetween cannot implement continuous single wafer carrying of wafers Wf.

Therefore, the transferring unit 1 is provided between the to-be-added single-wafer carrying apparatus 120 and the existing single wafer carrying apparatus 20, as shown in FIG. 2. The transferring unit 1 electrically connects the existing single wafer carrying apparatus 20 and the to-be-added single wafer carrying apparatus 120, as shown in FIG. 3. Accordingly, the transferring unit 1 can control the driving of the transferring robots 21 while synchronizing the single wafer carrying apparatuses 20 and 120 by the synchronization control unit 41.

The transferring robots 21 are arranged, as shown in FIG. 2, to receive all the wafers Wf, for example, carried in the R direction by the conveyor 57 in the single wafer carrying apparatus 20 and to hand over all the wafers to the conveyor 57 in the single wafer carrying apparatus 120. Specifically, as shown in FIG. 2, each transferring robot 21 receives the wafer Wf, which is held by the wafer mounting part 51 and carried in the R direction along the guide rail 53 in the single wafer carrying apparatus 20, by a scooping operation of each hand 303.

The wafers Wf that do not need to be transferred from the single wafer carrying apparatus 20 to the single wafer carrying apparatus 120 in FIG. 2 may not be scooped by the transferring robots 21 but carried in the single carrying manner in the single wafer carrying apparatus 20. That is, the transferring robot 21 is constructed to receive some wafers Wf selected among the plurality of wafers Wf carried in the single wafer carrying apparatus 20. According to the construction, since the wafers Wf which need to be carried only in the single wafer carrying apparatus 20 can not be transferred to the single wafer carrying apparatus 120 by the transferring robots 21, the wafers Wf can be efficiently carried.

Then, the transferring robots 21 hand over the wafers Wf received by the hands 303 to the wafer mounting parts 51 of the single wafer carrying apparatus 120, while being synchronized with the single wafer carrying apparatus 120. In the single wafer carrying apparatus 120, the wafers Wf are held by the wafer mounting parts 51 and carried in the R direction along the guide rail 53 in the single wafer carrying manner by the wafer mounting parts 51.

In addition, in a case where the transferring unit 1 comprises a plurality of transferring robots 21, one transferring robot 21 may transfer the wafers Wf from the single wafer carrying apparatus 20 to the single wafer carrying apparatus 120 and another transferring robot 21 may transfer the wafers Wf from the single wafer carrying apparatus 120 to the single wafer carrying apparatus 20. By the operation of the transferring robots 21, the transferring unit 1 can transfer the wafers Wf between the single wafer carrying apparatuses 20 and 120.

Figure 6:
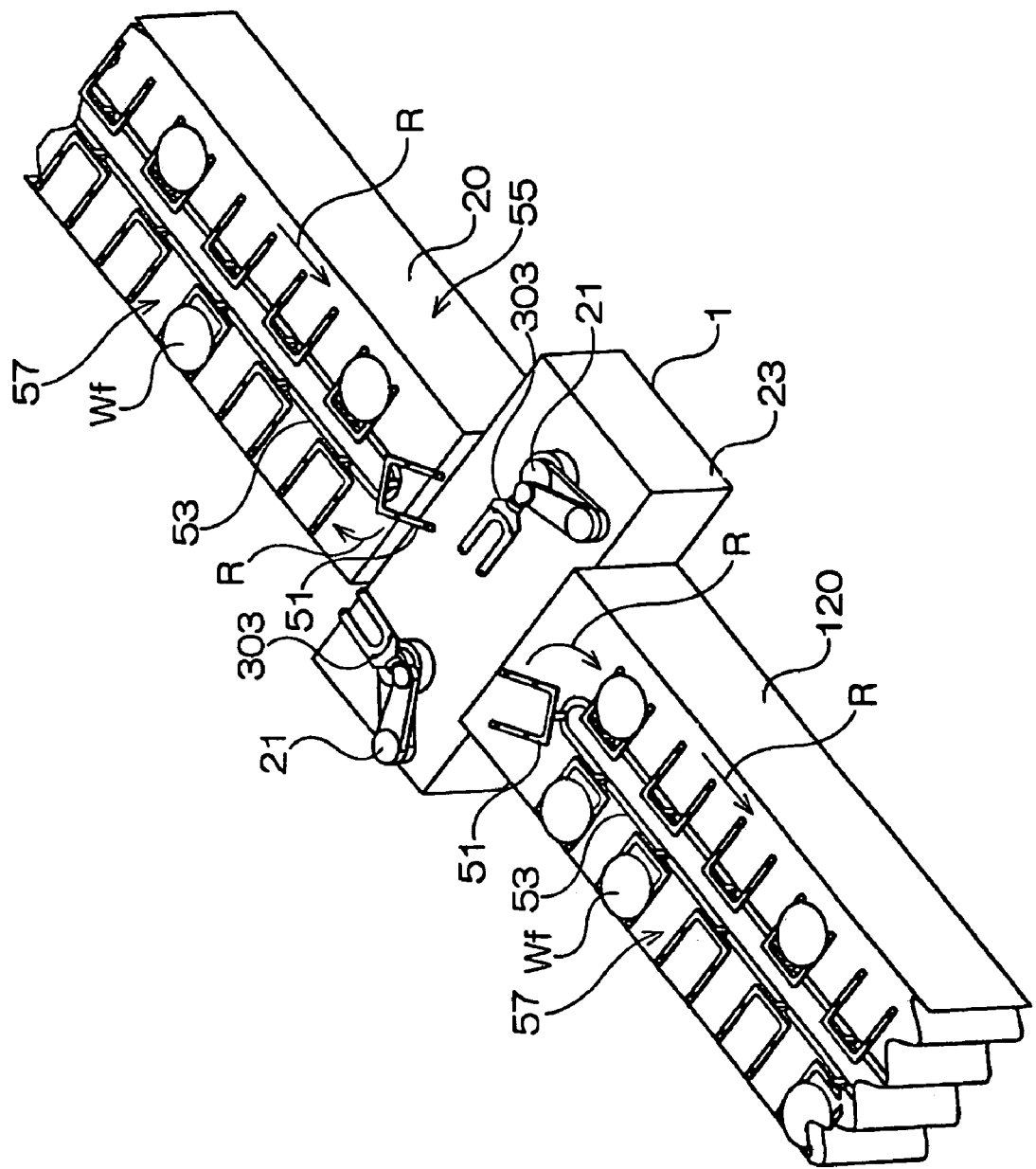
FIG. 6 is a perspective view illustrating an example of a state in which a single wafer carrying apparatus is added.

It should be noted that the transferring unit 1 may be provided between the single wafer carrying apparatuses 20 and 120 in place of being provided on at least one side of the connection portion of the single wafer carrying apparatuses 20 and 120, as shown in FIG. 6. Even in the construction, in the transferring unit 1, it is also possible to carry all or some of the wafers Wf between the single wafer carrying apparatuses 20 and 120 by the similar operation.

According to the first embodiment of the present invention, it is possible to easily add the new single wafer carrying apparatus 120 to the existing single wafer carrying apparatus 20. By means of the transferring unit 1, the conveyors of the existing single wafer carrying apparatus 20 and the added single wafer carrying apparatus 120 can be used as a single continuous conveyor. According to the first embodiment of the present invention, the single wafer carrying apparatus 120, if needed, may be connected to the single wafer carrying apparatus 20 by means of the transferring unit 1, so that there is no need to provide a long conveyor line in an initial stage in consideration of the future extension. Therefore, it is possible to suppress initial investment and remove unnecessary space in a workplace. In addition, at the time of extension, the needed length of conveyor can be extended at the needed time, so that it is possible to suppress investment. Since the conveying line can be constructed by combining the single wafer carrying apparatuses 20 and 120, it is possible to obtain various layouts freely.

According to the first embodiment, since only the necessary wafers Wf are transferred between the single wafer carrying apparatuses 20 and 120, it is possible to suppress unnecessary carrying between the single wafer carrying apparatuses 20 and 120 in comparison with the case of conveyor lines for the single wafer carrying apparatuses 20 and 120 being provided in advance. Therefore, TAT (Turn Around Time) is reduced, so that the wafers Wf can be efficiently carried.

According the first embodiment, at the time of transferring the wafers Wf between the existing single wafer carrying apparatus 20 and the to-be-added single wafer carrying apparatus 120, one transferring robot 21 can perform the transferring operation while being synchronized with only one of the existing single wafer carrying apparatus 20 and the added single wafer carrying apparatus 120, so that the control can be easily performed. It should be noted that the transferring unit 1 may be provided between the single wafer carrying apparatuses 20 and 120, as shown in FIG. 6, in place of being provided at the side of the connection portion of the single wafer carrying apparatus 20 and 120.

Second Embodiment

Figure 7:
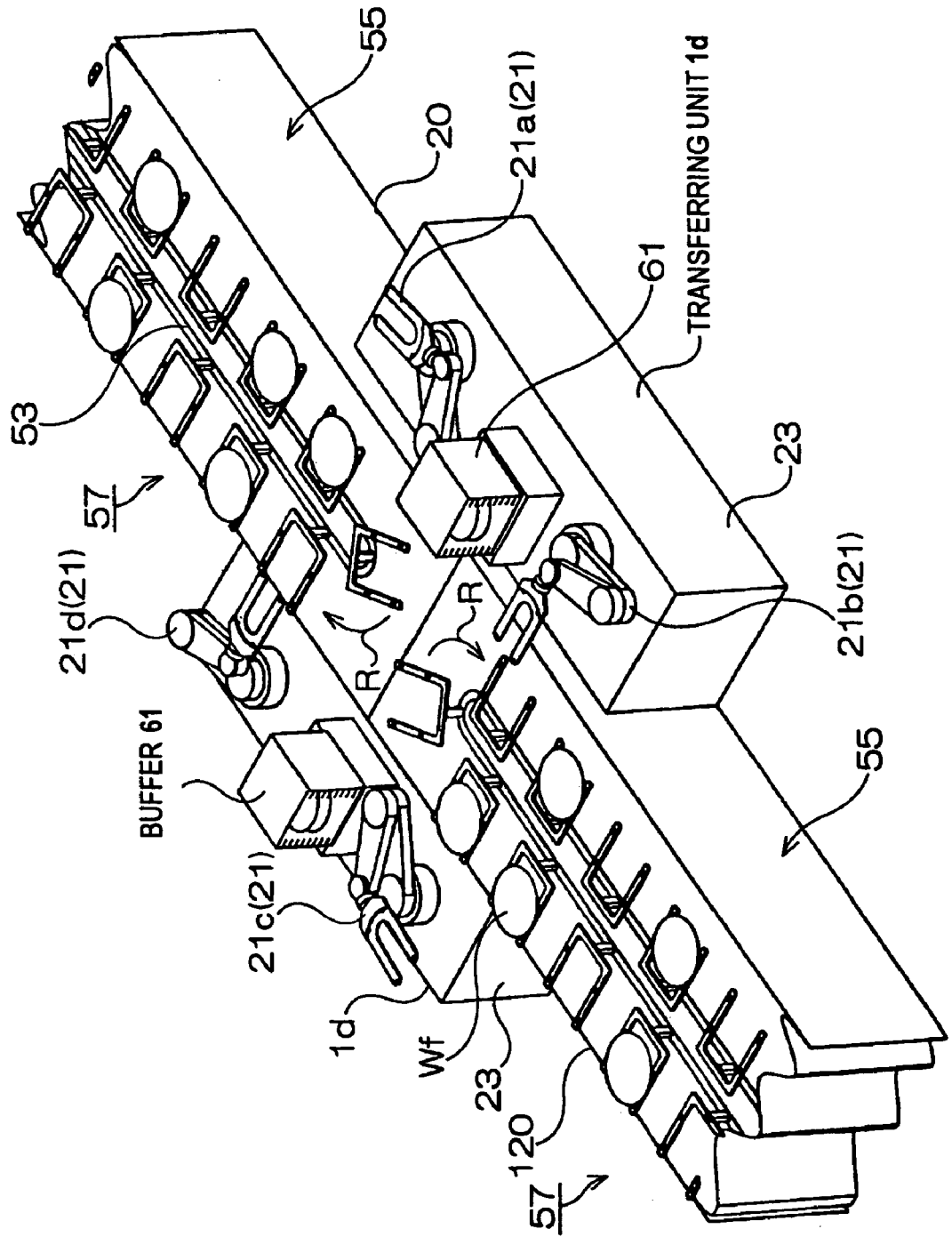
Figure 8:
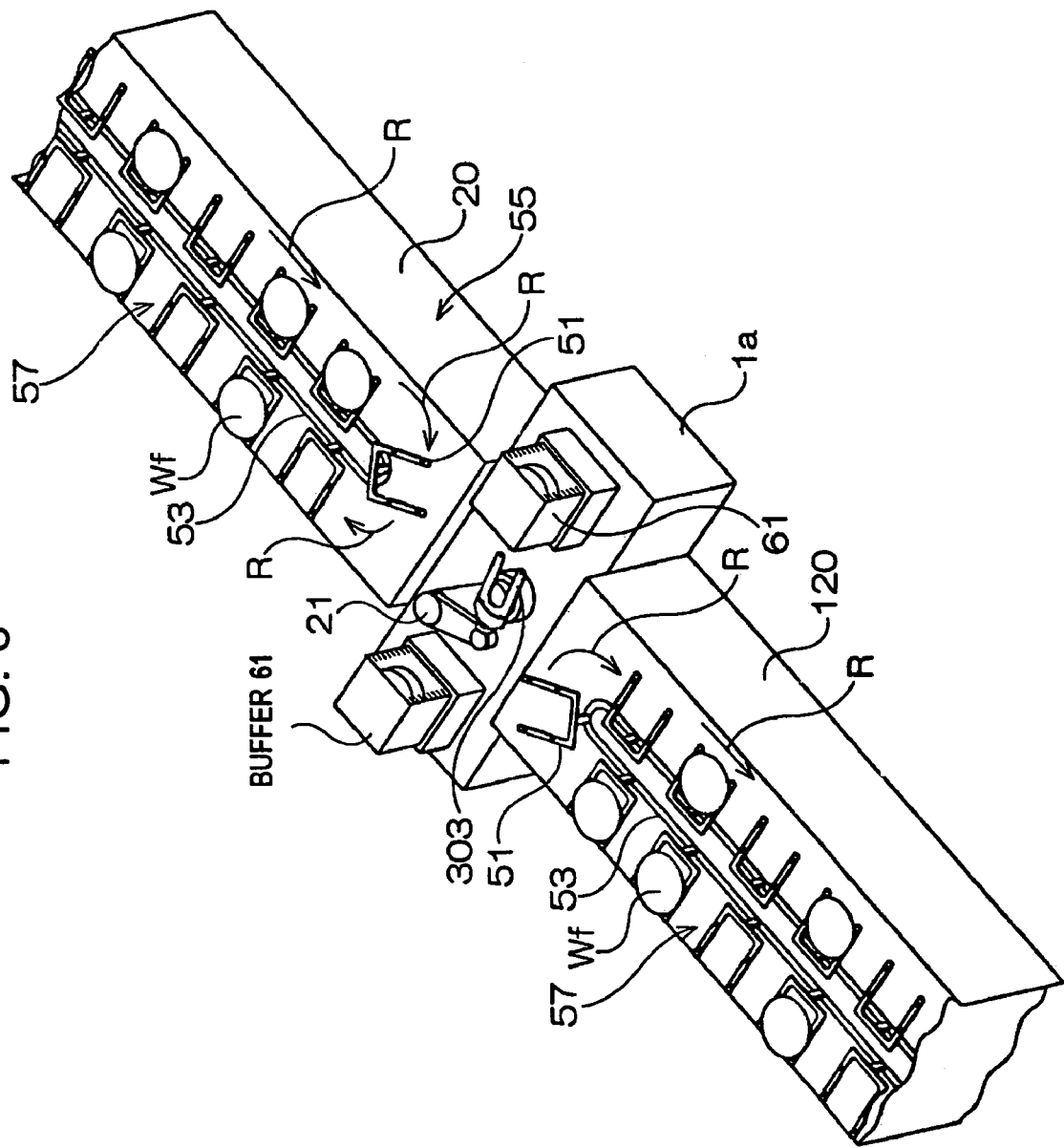
Figure 9:
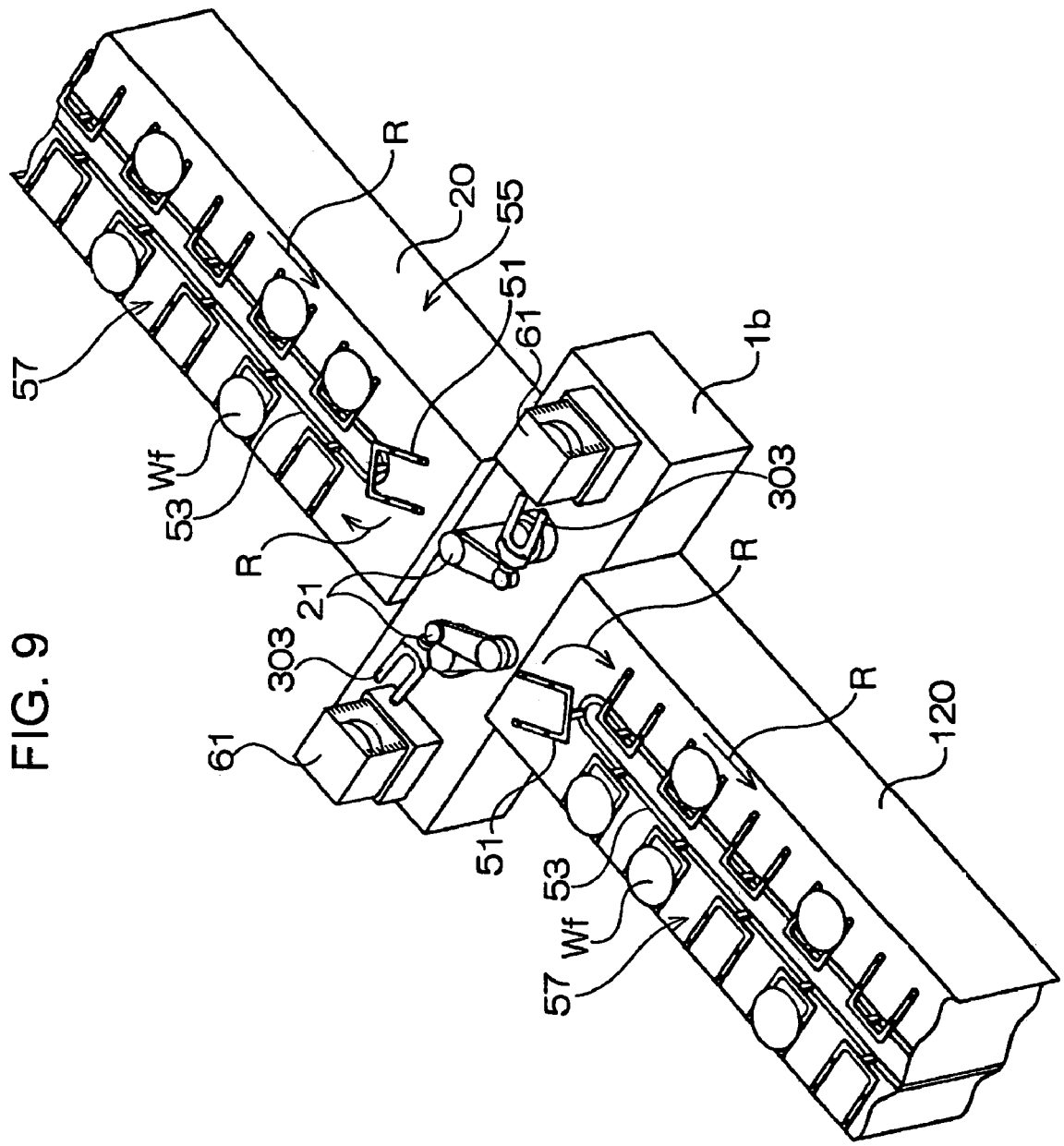

FIGS. 7, 8 and 9 are perspective views illustrating examples of constructions of a transferring unit 1a and the like to which a transferring apparatus of the second embodiment is adapted.

Since the same components of the transferring units 1d, 1a and 1b of the second embodiment as those of the transferring unit 1 of the first embodiment shown in FIGS. 1 to 6 are indicated by the same reference numerals, description will be mainly made on the different points.

In order to extend the carrying distance of the wafers Wf, the single wafer carrying apparatus 120 is connected to the single wafer carrying apparatus 20 through the transferring units 1d, 1a and 1b as shown in FIGS. 7, 8, and 9, respectively. As a result, the single wafer carrying apparatuses 20 and 120 constitute a substantially-straight continuous conveyor line.

In place of the transferring unit 1 shown in FIG. 1, the transferring units 1d, 1a and 1b are provided between the processing apparatuses 23 and 24 and the processing apparatuses 26 and 27 of the semiconductor manufacturing apparatus 100. Characteristically, the transferring units 1d, 1a, and 1b of FIGS. 7, 8, and. 9, respectively, comprise buffers 61, which are not provided in the transferring unit 1 of the first embodiment. The transferring unit 1d has the same construction as that of the transferring unit 1 of the first embodiment except for the buffer 61 being provided. The buffer 61 has a function of temporarily storing at least one wafer Wf between the existing single wafer carrying apparatus 20 and the newly added single wafer carrying apparatus 120.

At least one buffer 61 may be provided corresponding to the transferring robots 21, as shown in FIG. 8, or a plurality of buffers 61 as shown in FIG. 9 may be provided so as to make pairs with the transferring robots 21. By the construction, since the buffer 61 is provided for every transferring robot 21, the transferring robots 21 can be easily controlled. Alternately, as shown in FIG. 7, a buffer 61 can be shared by a plurality of the transferring robots 21 (21a, 21b, 21c, 21d). By the construction, since the number of the buffers 61 is small, the transferring unit 1 d can be implemented at a low cost.

The constructions of the transferring units 1d, 1a, and 1b have been described. Next, an example of a state in which the wafers Wf are transferred by the transferring unit 1d and the like will be described. Here, the description will be mainly made on the different points from the first embodiment.

As shown in FIG. 7, each transferring robot 21 receives the wafer Wf, which is held by the wafer mounting part 51 and carried in the R direction along the guide rail 53 in the single wafer carrying apparatus 20, by the scooping operation of each hand 303. The wafers Wf that do not need to be transferred from the single wafer carrying apparatus 20 to the single wafer carrying apparatus 120 may not be scooped by the transferring robots 21 but carried in the single carrying manner in the single wafer carrying apparatus 20.

The transferring unit 1d of FIG. 7 immediately stores the wafers Wf received by the transferring robots 21a in the buffer 61. In a case the wafers. Wf is determined to be able to be transferred to the single wafer carrying apparatus 120, the transferring robots 21b hands over the wafers Wf stored in the buffer 61 while being synchronized with the wafer mounting parts 51 of the single wafer carrying apparatus 120. In the single wafer carrying apparatus 120, the wafers Wf are held in the wafer mounting parts 51 and, the wafer mounting parts 51 are continuously transferred in the R direction along the guide rail 53., In addition, since the same operation is performed in the transferring unit 1d of the opposite side, the wafers Wf are handed over from the single wafer carrying apparatus 120 to the single wafer carrying apparatus 20 in the single wafer carrying manner.

In such a construction, since it suffices that the transferring robots 21a and 21b operate in synchronization with the single wafer carrying apparatuses 20 and 120, respectively, the control can be easily performed. In addition, in such a construction, since the wafers Wf are handed over between the transferring robots 21 through the buffer 61, the handing-over can be surely performed.

Next, examples of states in which the wafers Wf are transferred by the transferring units 1a and 1b of FIGS. 8 and 9, respectively, will be described. In addition, the description will be mainly made on the different points from the first embodiment.

As shown in FIG. 8 or the like, each transferring robot 21 receives the wafer Wf, which is held by the wafer mounting part 51 and carried in the R direction along the guide rail 53 in the single wafer carrying apparatus 20, by the scooping operation of each hand 303 of the transferring robot 21. The wafers Wf that do not need to be transferred from the single wafer carrying apparatus 20 to the single wafer carrying apparatus 120 may not be scooped by the transferring robots 21 but carried in the single carrying manner in the single wafer carrying apparatus 20.

The transferring unit 1a and the like determine whether the wafer Wf received by the transferring robot 21 can be immediately transferred, to the single wafer carrying apparatus 120. In case of the wafer being able to be immediately transferred, the transferring robot 21 hands over the wafer Wf received by the hand 303 to the wafer mounting ports 51 of the single wafer carrying apparatus 120 while being synchronized therewith. In the single wafer carrying apparatus 120, the wafers Wf are held in the wafer mounting parts 51, and the wafer mounting parts 51 are continuously carried in the R direction along the guide rail 53 in the single wafer carrying manner.

In case of the wafers not being able to be immediately transferred, the following operations are performed. For example, in a case that there is no empty loading space in the wafer mounting parts 51 in the single wafer carrying apparatus 120, the transferring unit 1a and the like store the wafer Wf in the buffers 61 which are provided for the transferring unit 1a and the like. The case where wafers Wf cannot be immediately transferred includes a case that the wafers Wf can be mounted on the wafer mounting parts 51 in the single wafer carrying apparatus 120 but cannot be received by the processing apparatuses 23 and the like which are disposed along the single wafer carrying apparatus 120 and to which the wafers Wf are directed. Also in this case, the wafers Wf are stored in the buffer 61.

The transferring robot 21 hands over the wafers Wf stored in the buffer 61 while being synchronized with the wafer mounting parts 51 in the single wafer carrying apparatus 120. In the single wafer carrying apparatus 120, the wafers Wf are held in the wafer mounting parts 51, and the wafer mounting parts 51 are carried in the R direction along the guide rail 53 in the single wafer carrying manner.

In addition, a plurality of buffers, for example, two buffers 61 as shown in FIG. 8, may be provided on the same plane or in a stacked construction. The buffers 61 may be provided at the outsides of the transferring robot 21 as shown in FIG. 8 or between the two transferring robots 21 although not shown. In this construction, the two transferring robots 21 may share the buffer 61.

According to the second embodiment of the present invention, in addition to obtaining almost the same effects of the first embodiment, since the single wafer carrying is available within the respective conveyors 57 of the single wafer carrying apparatuses 20 and 120 shown in FIG. 7 and the like, it is possible to carry the wafers Wf to the suitable carrying distances. That is, according to the needed processes, when the wafers Wf need to be carried only by the single wafer carrying apparatus 20 in the single wafer carrying manner, the single wafer carrying can be performed only in the single wafer carrying apparatus 20 without handing over the wafers to the single wafer carrying apparatus 120. Since the single wafer carrying apparatus 20 and the like can change the carrying distance according to the needed carrying ability, it is possible to suppress unnecessary carrying of the wafer Wf. As a result, the semiconductor manufacturing apparatus 100 can efficiently manufacture the wafers Wf by improving the TAT (Turn Around Time) in comparison with the conventional one.

Third Embodiment

Figure 10:
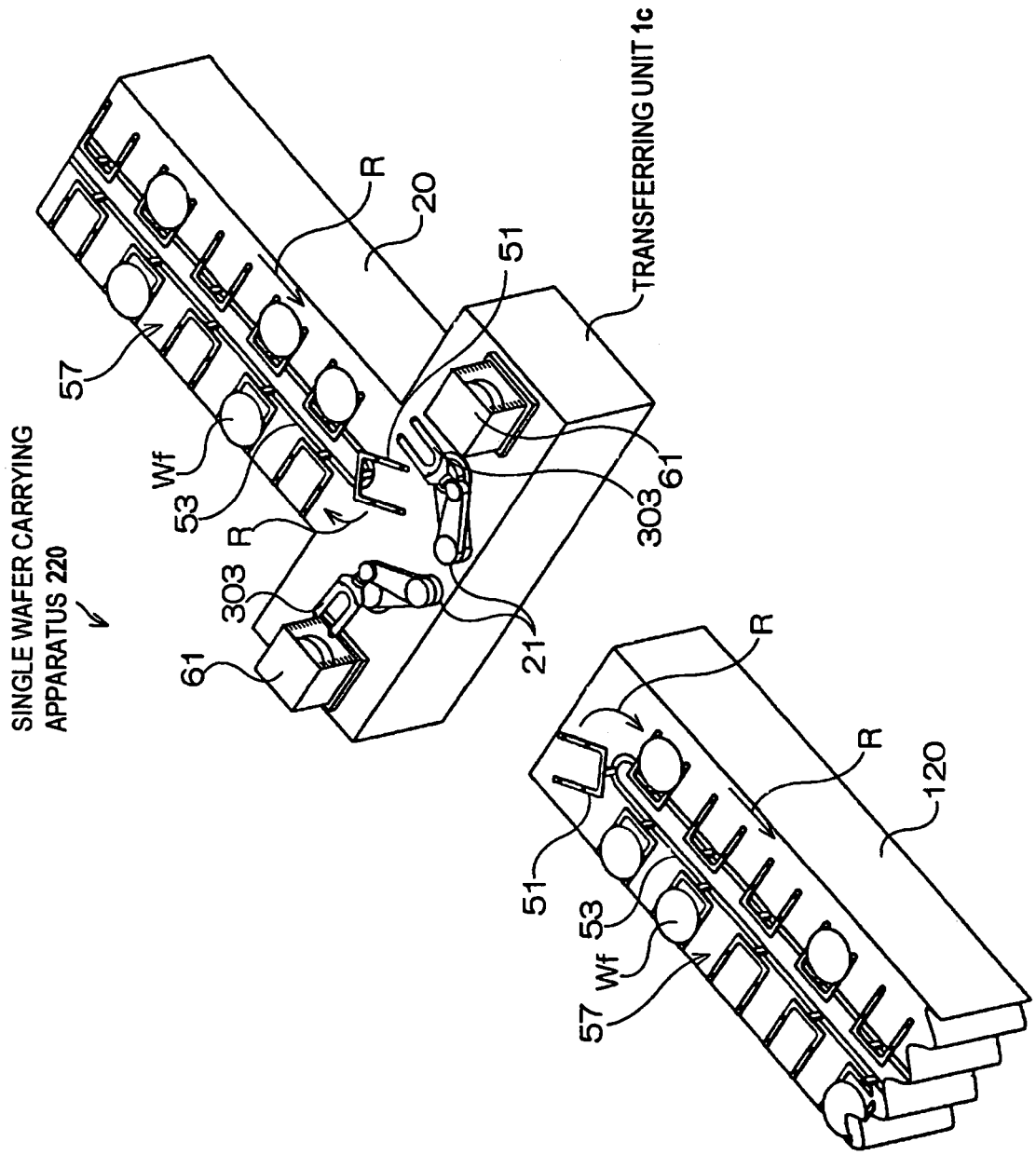
Figure 11:
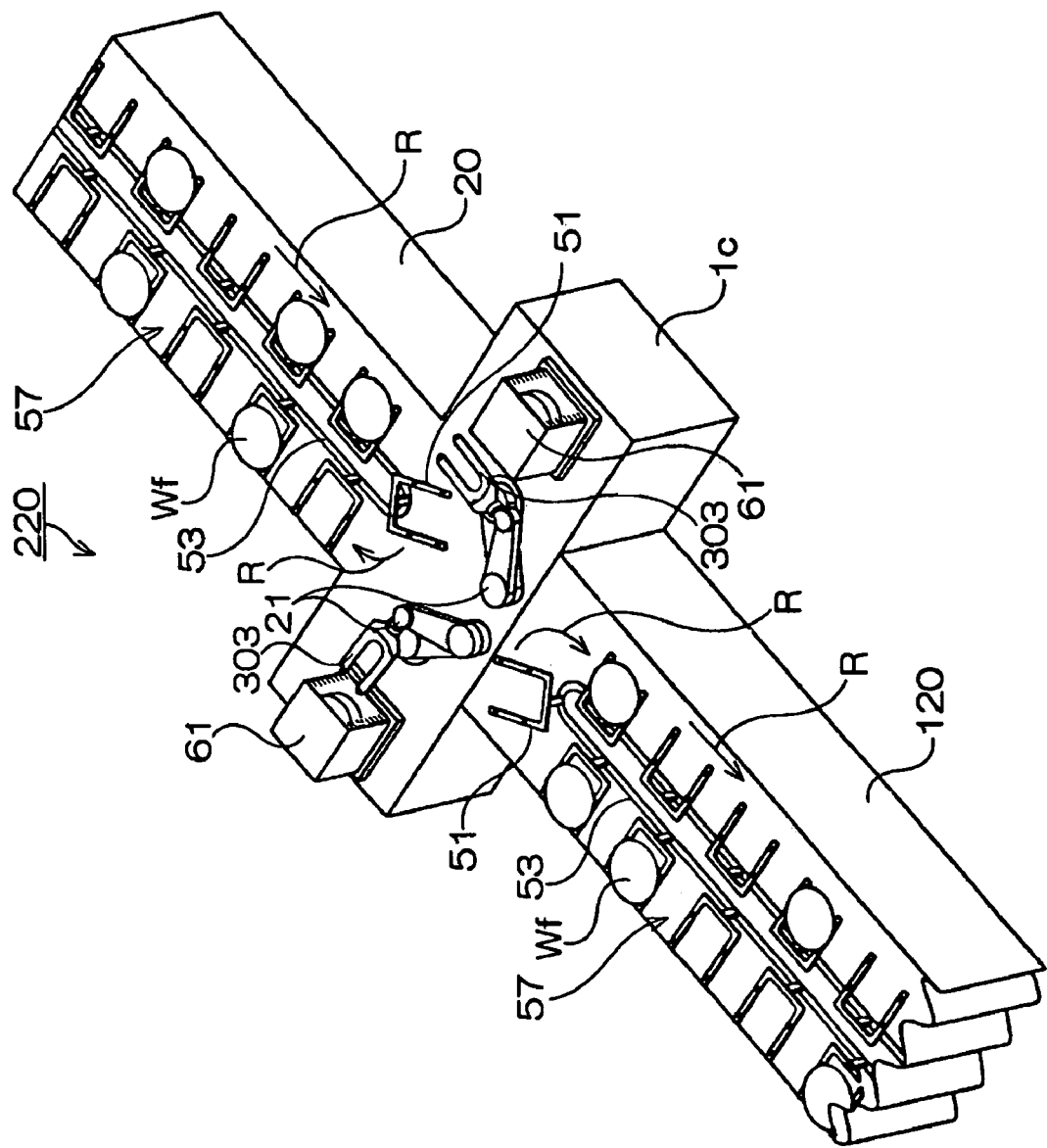

FIGS. 10 and 11 are perspective views illustrating examples of constructions of a transferring unit 1c and the like to which a transferring apparatus of the third embodiment is adapted.

Since the same components of the transferring unit 1c of the third embodiment as those of the transferring units 1 (1d, 1a and 1b) of the first (second) embodiment shown in FIGS. 1 to 4 (FIGS. 7 to 9) are indicated by the same reference numerals, description will be mainly made on the different points. It should be noted that the transferring units 1c may not comprise the buffer 61 as in the first embodiment.

Instead of the transferring units 1 of FIG. 1 or the like being provided, the transferring unit 1c is integrated with the end portion of the single wafer carrying apparatus 20. Specifically, the transferring unit 1c is characterized in that the single wafer carrying apparatus 20 is provided with the transferring unit 1c corresponding to the transferring units 1 (1d, 1a and 1b) of the first (second) embodiment in advance. That is, a single wafer carrying apparatus 220 is constructed by integrating the transferring unit 1c to the single wafer carrying apparatus 20. In addition, similarly, the transferring unit 1c may be also integrated with the single wafer carrying apparatus 120.

The single wafer carrying apparatus 220 has the above construction. Next, an example of a state in which the wafers Wf are transferred by the transferring unit 1c will be described. Herein, the description will be mainly made on the different points from the first and second embodiments.

In order to extend the carrying distance of the wafers Wf, as shown in FIG. 11, the single wafer carrying apparatus 120 is connected to the transferring unit 1c provided at an end portion of the single wafer carrying apparatus 220, as shown in FIG. 10. As a result, the single wafer carrying apparatuses 220 and 120 constitute a substantially-straight continuous conveyor line.

As shown in FIG. 10, each transferring robot 21 receives the wafer Wf, which is held by the wafer mounting part 51 and carried in the R direction along the guide rail 53 in the single wafer carrying apparatus 220, by the scooping operation of each hand 303 of the transferring robot 21. The wafers Wf that do not need to be transferred from the single wafer carrying apparatus 220 to the single wafer carrying apparatus 120 may not be scooped by the transferring robots 21 but carried in the single carrying manner in the single wafer carrying apparatus 220.

The transferring unit 1c determines whether the wafers Wf received by the transferring robots 21 can be immediately transferred to the single wafer carrying apparatus 120. In case of the wafers being able to be immediately transferred, the transferring robot 21 hands over the wafers Wf received by the hands 303 to the wafer mounting parts 51 of the single wafer carrying apparatus 120 while being synchronized therewith. In the single wafer carrying apparatus 120, the wafers Wf are held in the wafer mounting parts 51, and the wafer mounting parts 51 are continuously carried in the R direction along the guide rail 53 in the single wafer carrying manner.

In case of the wafers not being able to be immediately transferred, the following operations are performed. For example, in a case that there is no empty loading space in the wafer mounting parts 51 in the single wafer carrying apparatus 120, the transferring unit 1c stores the wafers Wf in the buffers 61 which are provided for the transferring unit 1aAnother case of the wafers incapable of being transferred, for example, is the case that the wafers Wf can be mounted on the wafer mounting parts 51 in the single wafer carrying apparatus 120 but can not be received by the processing apparatuses 23 and the like which are disposed along the single wafer carrying apparatus 120 and to which the wafers Wf are directed. Also in this case, the wafers Wf are stored in the buffer 61.

The transferring robot 21 hands over the wafers Wf stored in the buffer 61 to the wafer mounting parts 51 in the single wafer carrying apparatus 120 while being synchronized therewith. In the single wafer carrying apparatus 120, the wafers Wf are held in the wafer mounting parts 51, and the wafer mounting parts 51 are carried in the R direction along the guide rail 53 in the single wafer carrying manner.

It should be noted that a plurality of buffers, for example, the two buffers 61 as shown in FIG. 8, may be provided on the same plane or in a stacked construction. The buffers 61 may be provided at the outsides of the transferring robot 21 as shown in FIG. 8 or between the two transferring robots 21 although not shown. In this construction, the two transferring robots 21 may share the buffer 61.

According to the third embodiment of the present invention, in addition to obtaining almost the same effects of the first and second embodiments, it suffices that a new single wafer carrying apparatus 120 is newly added to the existing single wafer carrying apparatus 220 in case of adding the single wafer carrying apparatus 220 in order to increase the ability of carrying wafer Wf. That is, the single wafer carrying apparatus 220 is provided with the transferring unit 1c in advance, it suffices that the single wafer carrying apparatus 120 is installed so as to be connected to the single wafer carrying apparatus 220 through the transferring unit 1c. As a result, the single wafer carrying apparatus 220 and the like can change the carrying distance according to the needed carrying ability, and it is possible to suppress unnecessary carrying of the wafer Wf.

Fourth Embodiment

Figure 12:
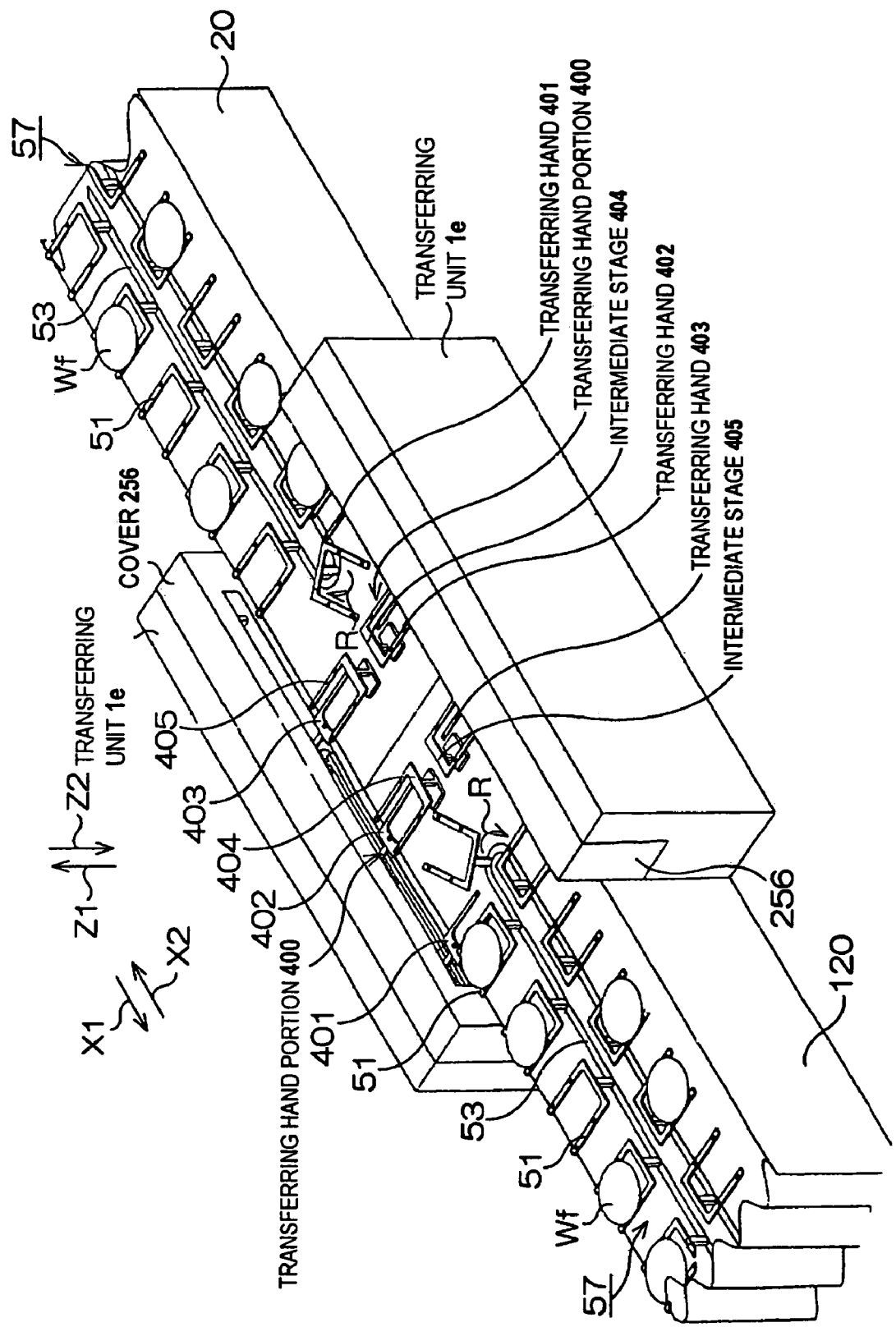

FIG. 12 is a perspective view illustrating an example of the construction of the transferring unit 1e to which a transferring apparatus of the fourth embodiment is adapted.

Figure 13:
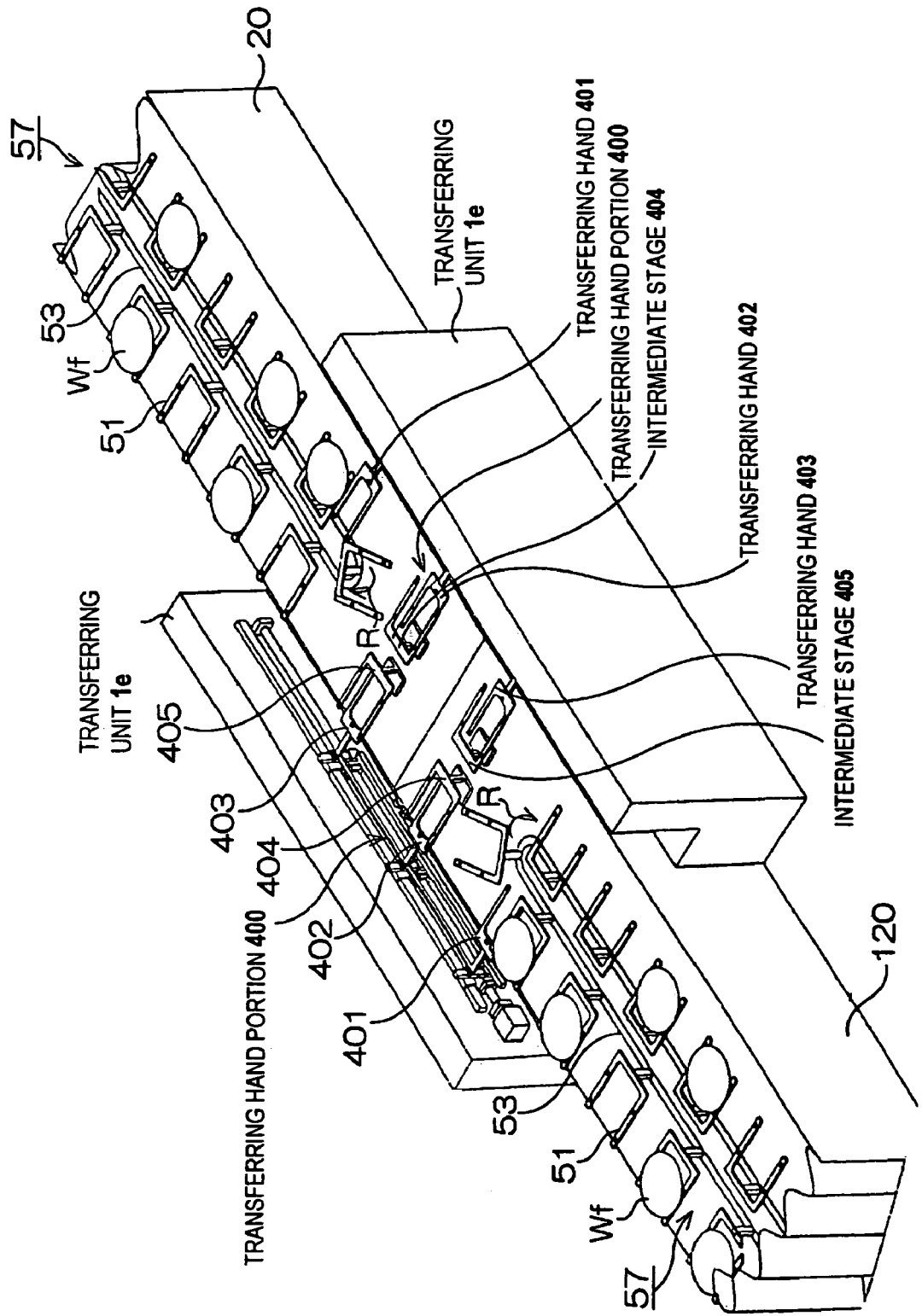
Figure 14:
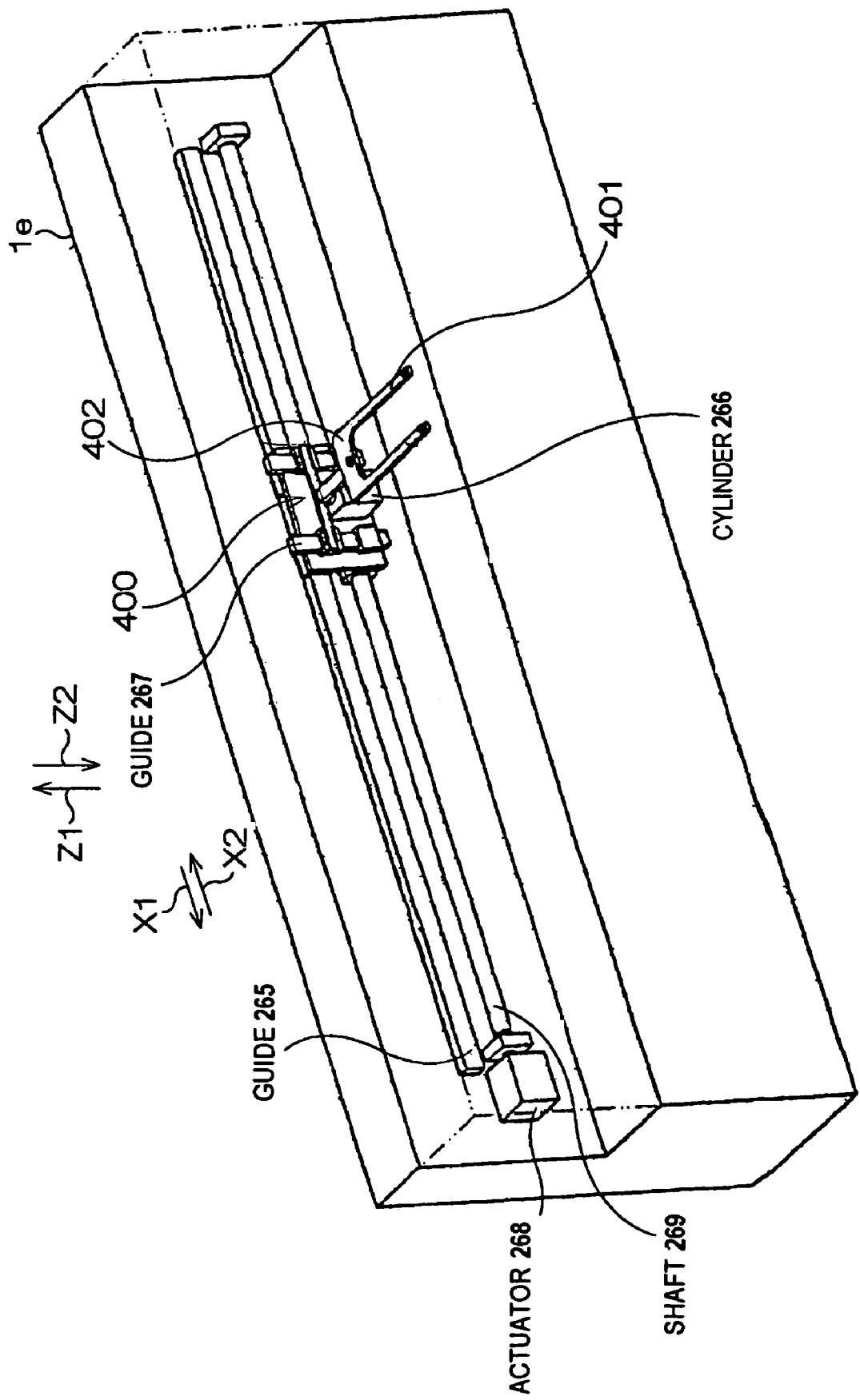
FIG. 14 is a perspective view illustrating an example of a construction of a transferring hand portion.

FIG. 13 is a perspective illustrating an example of a state in which a cover 256 is removed from the transferring unit 1e of FIG. 12 and the up-down moving mechanism thereof is exposed. FIG. 14 is a perspective view illustrating an example of a detailed construction of the up-down moving mechanism of each transferring unit 1e of FIG. 13.

Since the same components of the transferring units 1e of the fourth embodiment shown in FIG. 12 as those of the transferring units 1 of the first embodiment shown in FIGS. 1 to 6 are indicated by the same reference numerals, description will be mainly made on the different points.

Instead of the transferring units 1 of FIG. 1 or the like, the transferring unit 1e is provided near a connection portion of the single wafer carrying apparatus 20 and 120, for example, on both sides of the connection portion. The transferring unit 1e of FIG. 12 may be constructed to be separated from the single wafer carrying apparatus 20 or to be integrated with the single wafer carrying apparatus 20.

Each of the single wafer carrying apparatuses 20 and 120 and the transferring units 1e comprises a cover and a cleaning device (not shown), so that the ambient of a region through which the wafers Wf pass can be isolated form the external ambient and maintained clean.

In order to extend the carrying distance of the wafers Wf, the single wafer carrying apparatus 20 is connected to the single wafer carrying apparatus 120 through the transferring unit 1e, as shown in the figure. As a result, the single wafer carrying apparatuses 20 and 120 constitute a substantially-straight continuous conveyor line.

Each of the transferring units 1e comprises a transferring hand portion 400 having a plurality of transferring hands 401, 402, and 403. Although there are three hands in the embodiment, two or less hands or four or more hands are available. One wafer Wf can be mounted on the respective transferring hands 401, 402, and 403.

Each of the transferring hands 401, 402, and 403 are adapted to move, for example, simultaneously in up-down directions Z1 and Z2 and horizontal directions X1 and X2. The construction by which the transferring hands 401, 402, and 403 are moved in the up-down directions Z1 and Z2 is as shown in FIG. 13. FIG. 13 illustrates an example of the state in which the covers 256 provided in FIG. 12 are removed from the transferring units 1e.

FIG. 14 illustrates an enlarged view of the up-down moving mechanism and the horizontal moving mechanism shown in FIG. 12. Although all the transferring hands 401, 402, and 403 are illustrated in FIGS. 12 and 13, only the transferring hand 401, as an example, is illustrated in FIG. 14 for simplification. The transferring hand portion 400 having one transferring hand 401 comprises a guide 267 and a cylinder 266 as the up-down moving mechanism and a shaft 269 and actuator 268 as the horizontal moving mechanism, as shown in the figure.

The actuator 268 has a function of rotating the shaft 269 the shaft 269 is a shaft extending along the horizontal directions X1 and X2 has a construction of moving the transferring hand portion 400 along the horizontal directions X1 and X2 by the operation of the actuator 268. Incidentally, the, up-down moving mechanism may be a cam mechanism using a motor. In addition, in case of the plurality of the transferring hands 401, 402, and 403 being provided, it is preferable that the up-down moving mechanism has a construction of moving the plurality of the transferring hands as a group in the horizontal directions, as shown in FIGS. 12 and 13.

The guide 267 of FIG. 14 is a member being extended in the vertical directions Z1 and Z2. The cylinder 266 has a construction of moving the transferring hand 401 in the vertical directions Z1 and Z2 along the guide portion 267 by the operation thereof. Incidentally, the up-down moving mechanism may be a cam mechanism using a motor. In addition, in case of the plurality of the transferring hands 401, 402, and 403 being provided, it is preferable that the up-down moving mechanism has a construction of moving the plurality of the transferring hands as a group in the up-down directions, as shown in FIGS. 12 and 13.

By moving the transferring hand portion 400 in the up-down and horizontal directions with the aforementioned constructions in accordance with the moving of the single wafer carrying apparatuses 20 and 120, the wafers Wf are transferred from the one single wafer carrying apparatus to the other single wafer carrying apparatus. In addition, in case that each transferring unit 1e comprises two or more hands, for example, it is necessary to provide (transferring hand number-1) of intermediate stages 404 and 405, which are used to temporarily load the wafers Wf at the time of transferring. Herein, since there are three transferring hands 401, 402, and 403, two intermediate stages 404 and 405 are provided.

A detailed construction example of the transferring units 1e has been described. Next, an example of a state in which the wafers Wf is transferred will be described.

As shown in FIG. 12, the wafers Wf are held in the wafer mounting parts 51 which are carried in the R direction along the guide rail 53 in the single wafer carrying apparatus 20.

Figure 15:
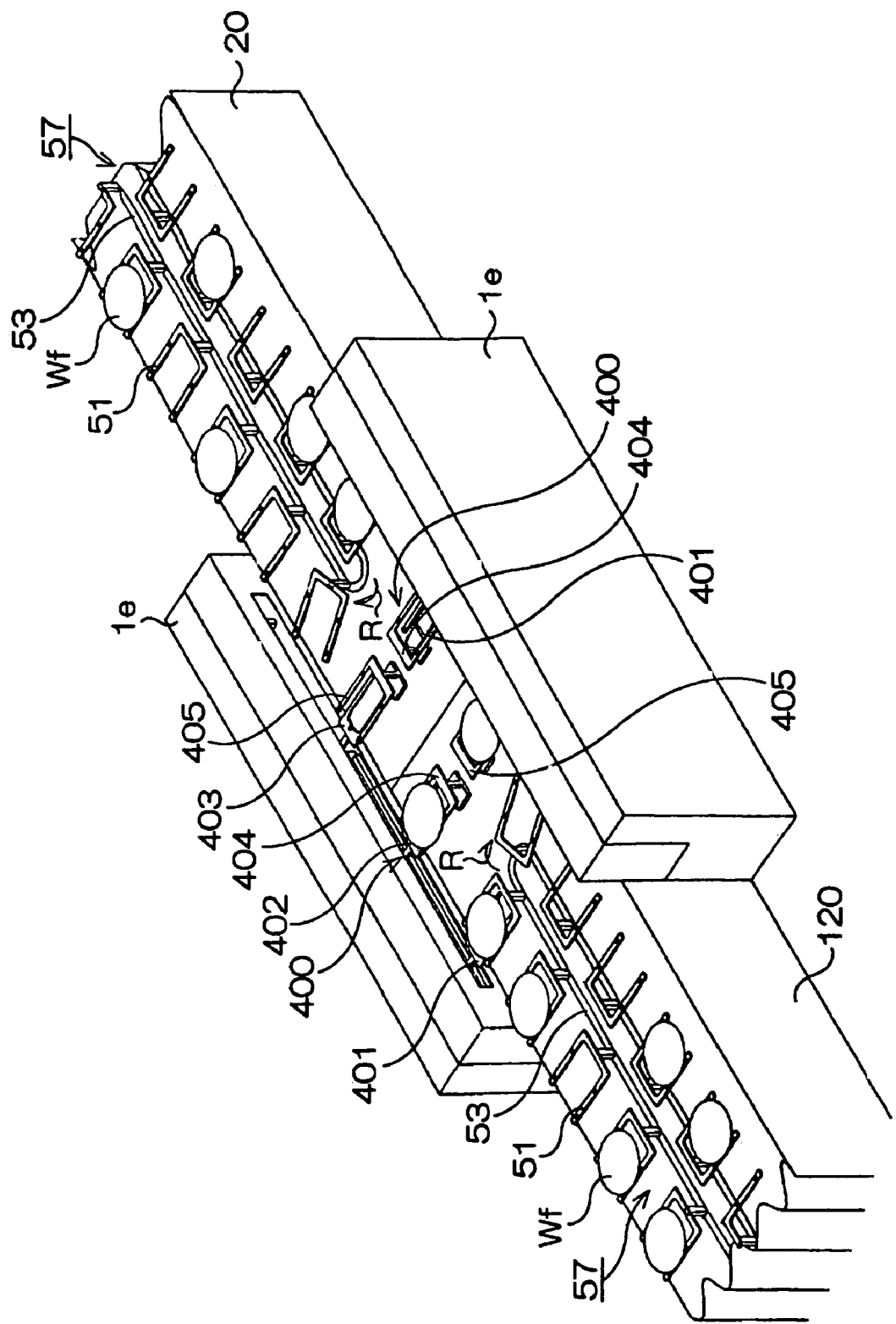
Figure 16:
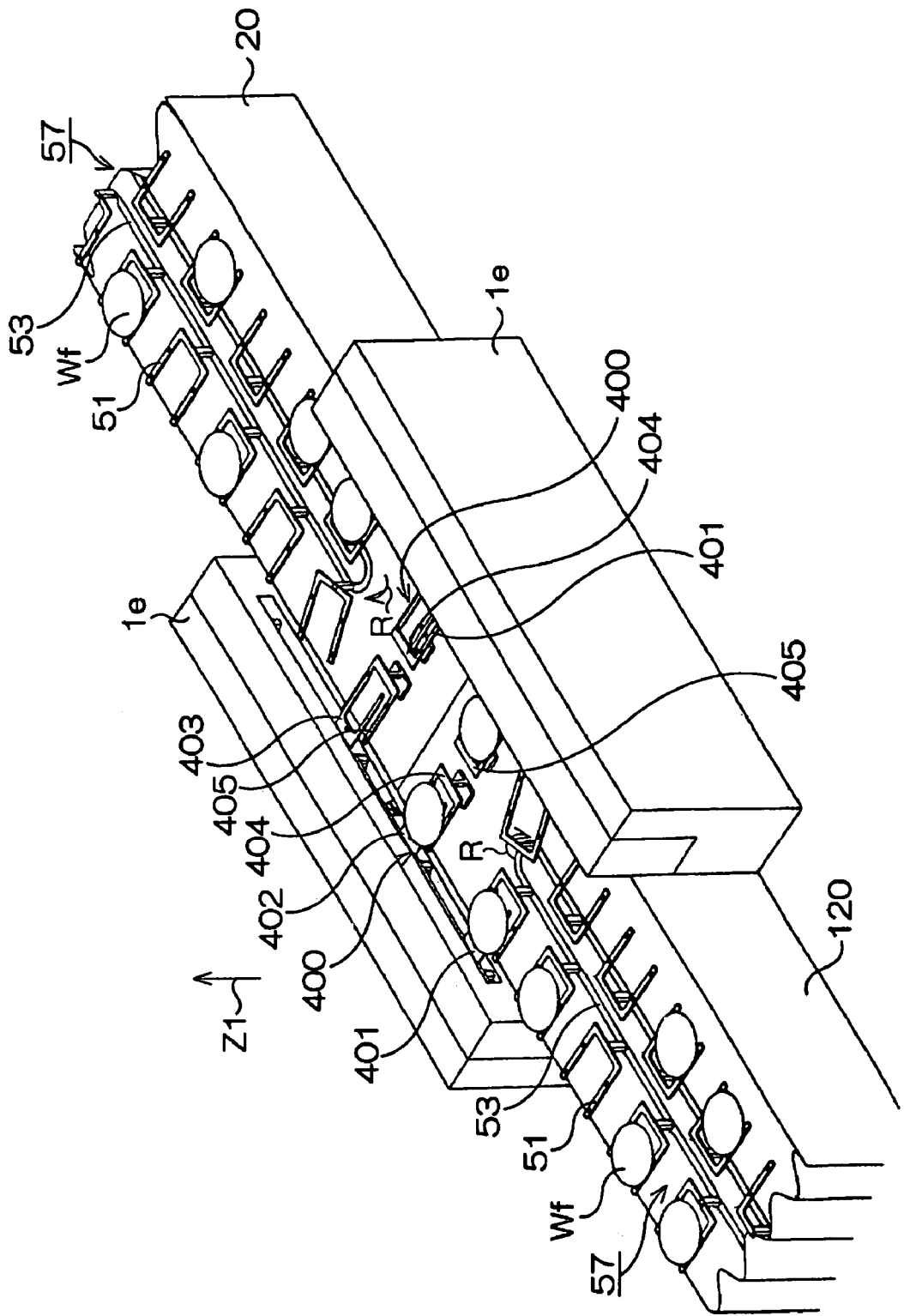

Firstly, the transferring hand portion 400 of the transferring unit 1e stands by at a predetermined receiving position. At the same time that the wafer mounting part 51 is passing through the predetermined receiving position as shown in FIG. 15, the wafer Wf are scooped in the up direction Z1 from the bottom and received by the transferring hand 401 in accordance with the moving the conveyor 57 of the single wafer carrying apparatus 20, as shown in FIG. 16. At this time, the wafers Wf disposed on the intermediate stages 404 and 405 are also scooped by the transferring hands 402 and 403, respectively.

Figure 17:
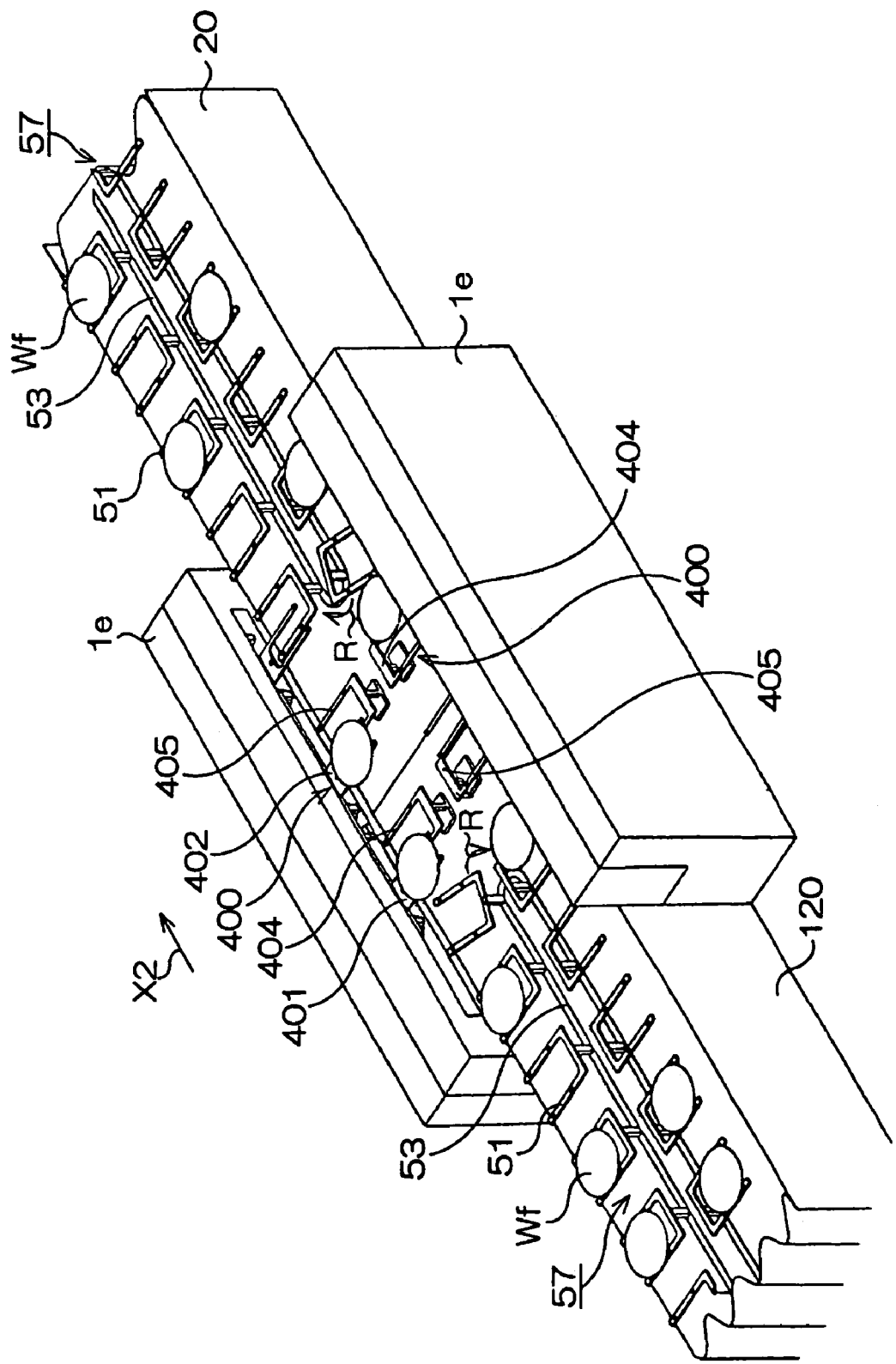
Figure 18:
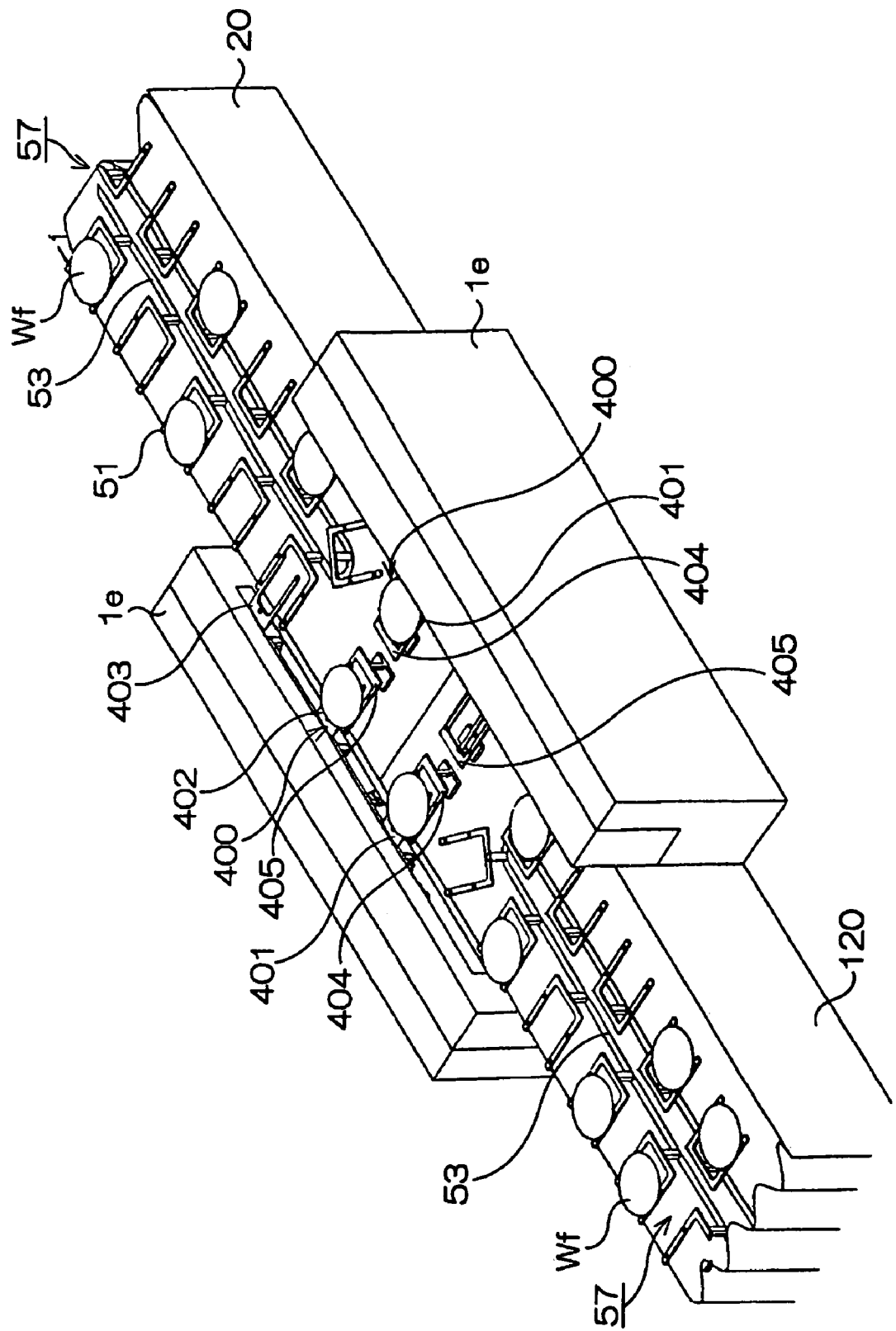
Figure 19:
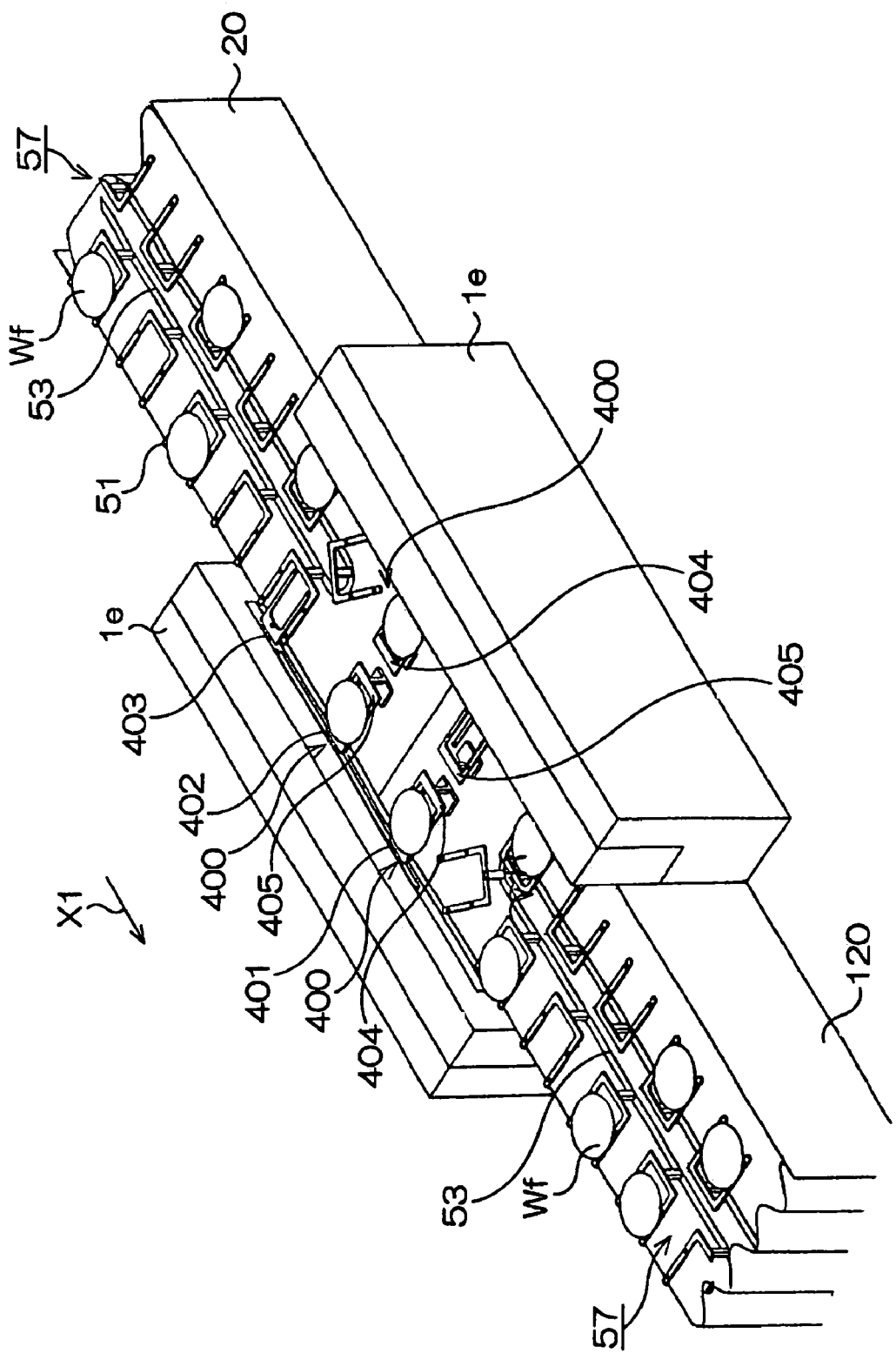

In the state that each of the wafers Wf is scooped, as shown in FIG. 17, the transferring hand portion 400 moves in the horizontal direction X2 as shown in FIG. 16 to arrive at the predetermined hand-over position as shown in FIG. 18. At the time that the wafer mounting parts 51 on the single wafer carrying conveyor 120 are passing through the predetermined hand-over positions, the transferring hand portion 400 hands over the wafers Wf to the intermediate stage 404 as shown in FIG. 19 in accordance with the moving of the conveyor 57 of the single wafer carrying apparatus 120.

At the same time, if another transferring hand portion 400 holds a wafer Wf, the transferring hand portion 400 hands over the wafer Wf to the wafer mounting parts 51 on the conveyor 57. Simultaneously, the wafer Wf on the intermediate stage 404, the wafer Wf temporarily mounted on the intermediate stage 405, and the wafer Wf scooped from the single wafer carrying apparatus 20 are transferred to the wafer mounting parts 51 on the single wafer carrying apparatus 120, the intermediate stage 405, and the intermediate stage 404, respectively.

The transferring hand portion 400 having handed over the wafer Wf immediately moves along the horizontal direction X1 to the receiving position and stands by. In the single wafer carrying apparatus 120, the wafers Wf are held on the wafer mounting parts 51, and the wafer mounting parts 51 are carried in the R direction along the guide rail 53 in a single wafer carrying manner. This is one cycle of the operation. This operation is performed irrespective of the presence or absence of a wafer on the wafer mounting parts 51 of the single wafer carrying apparatus 20.

By the repetition of this operation, all the wafers Wf carried by the single wafer carrying apparatus 20 are transferred to the single wafer carrying apparatus 120. The transferring unit 1e provided at the opposite of the single wafer carrying apparatus performs almost the same operation except that the carrying direction is reverse, and all the wafer Wf carried by the single wafer carrying apparatus 120 are transferred to the single wafer carrying apparatus 20.

Figure 20:
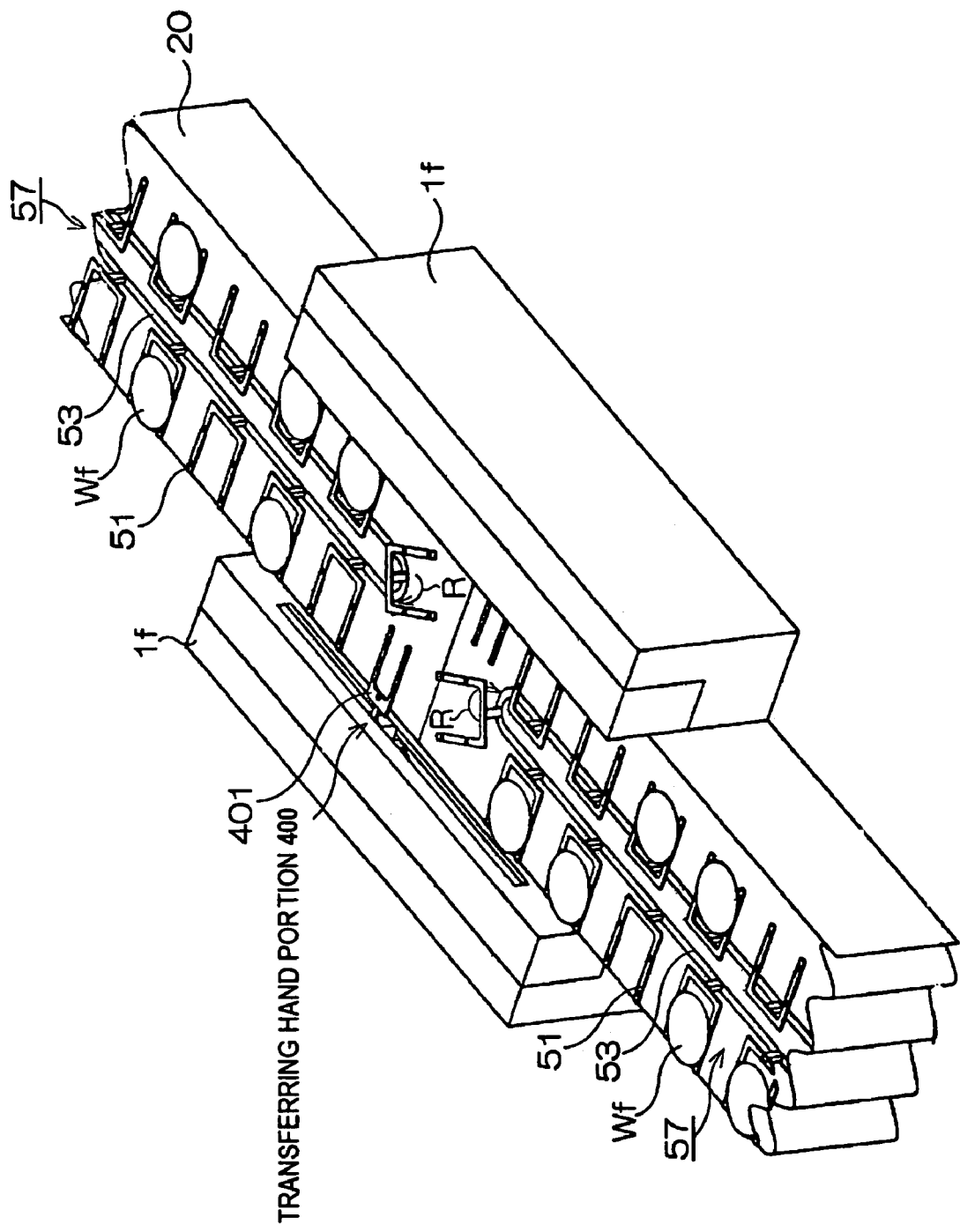

It should be noted that in the fourth embodiment, the transferring unit may have no intermediate stage similar to the transferring unit if shown in FIG. 20. The transferring unit 1f has almost the same construction as that of the aforementioned transferring units 1e except for the following points. The transferring unit if is different from the aforementioned transferring units 1e and the like in that the wafers Wf are carried between the wafer mounting parts 51 and 51 of the single wafer carrying apparatuses 20 and 120 by the only the transfer hand portions 400, instead of the wafers Wf being carried through the intermediate stages by the transferring hand portions 400. According to the construction, since the intermediate stages are not necessary, cost can be further suppressed in comparison with the transferring unit 1e having the construction as shown in FIG. 12.

As such, according to the fourth embodiment of the present invention, since the transferring hand portions 400 can transfer all the wafers, without changing the order, from the one single wafer carrying apparatus 20 to the other single wafer carrying apparatus 120, and even in the state that the conveyors 57 are connected to each other, they can be used as if they were one single wafer carrying apparatus.

In addition, according to the fourth embodiment of the present invention, since the transferring unit 1e is used, the single wafer carrying apparatus can be provided in accordance with production ability. Therefore, suitable investment is available and freedom of layout is improved, so that almost the same effects as those of the first embodiment can be obtained. Furthermore, in the fourth embodiment, since all the wafers Wf are transferred, the timing for dispatching the wafers Wf between the single wafer carrying apparatuses 20 and 120 and the transferring hand portions 400 or the control of the empty states of the wafer mounting parts 51 on the single wafer carrying apparatuses 20 and 120 is not necessary in comparison with the first to third embodiments. Therefore, the control can be easily performed.

The present invention is not limited to the above embodiments, and various modifications may be made thereto without departing from the appended claims. For example, respective constructions of the above embodiments may be changed by arbitrarily omitting or combining some portion thereof unlike the above descriptions. In addition, in the above embodiments, the semiconductor wafer is used as an example of a substrate wafer as a carried product. However, the carried product is not so limited, and the embodiments can be adapted to other types of substrate wafers. In addition, instead of the substrate wafers, the above embodiments can be adapted to an electronic device manufacturing substrate as a carried product. The electronic device manufacturing substrate may include, for example, a substrate for manufacturing a liquid crystal display device or a quartz device.

What is claimed is:

1. A carrying apparatus comprising:
   a plurality of carrying means, each carrying means including:
   support means for supporting carried products,
   guide means for controlling the moving direction of the support means, the guide means being provided along a processing apparatus for processing the carried products, and moving means for moving the support means along the guide means; and transferring means being provided between the plurality of carrying means, wherein the transferring means includes:

synchronization control means for synchronizing the moving means of one carrying means with the moving means of another carrying means; and at least one hand-over means for receiving the carried products from the support means of the one carrying means and handing over the carried products to the support means of the other carrying means.

2. The carrying apparatus according to claim 1, wherein the hand-over means receives some carried products selected among the plurality of the carried products which are carried by the one carrying means.

3. The carrying apparatus according to claim 1, wherein the hand-over means receives all the carried products among the plurality of the carried products which are carried by the one carrying means.

4. The carrying apparatus according to claim 1, further comprising at least one buffer means for temporarily storing the carried products between the one carrying means and the other carrying means.

5. The carrying apparatus according to claim 4, wherein the transferring means apparatus is integrated with the carrying means.

6. The carrying apparatus according to claim 5, wherein each of the carried products comprises a substrate wafer.

7. The carrying apparatus according to claim 6, wherein the substrate wafer comprises a semiconductor wafer.

8. The carrying apparatus according to claim 5, wherein each of the carried products comprises an electronic device manufacturing substrate.

9. The carrying apparatus according to claim 8, wherein the electronic device manufacturing substrate comprises a liquid crystal device substrate.

10. The carrying apparatus according to claim 8, wherein the electronic device manufacturing substrate comprises a quartz device substrate.

11. The carrying apparatus according to claim 4, wherein each of the buffer means is provided in combination with each of the hand-over means.

12. The carrying apparatus according to claim 4, wherein the buffer means is shared by the plurality of the hand-over means.

13. The carrying apparatus according to claim 1, wherein each of the carried products comprises a substrate wafer.

14. The carrying apparatus according to claim 13, wherein the substrate wafer comprises a semiconductor wafer.

15. The carrying apparatus according to claim 1, wherein each of the carried products comprises an electronic device manufacturing substrate.

16. The carrying apparatus according to claim 15, wherein the electronic device manufacturing substrate comprises a liquid crystal device substrate.

17. The carrying apparatus according to claim 15, wherein the electronic device manufacturing substrate comprises a quartz device substrate.

18. The carrying apparatus according to claims 1 wherein the transferring means apparatus is integrated with the carrying means.

19. The carrying apparatus according to claim 18, wherein each of the carried products comprises a substrate wafer.

20. The carrying apparatus according to claim 19, wherein the substrate wafer comprises a semiconductor wafer.

21. The carrying apparatus according to claim 18, wherein each of the carried products comprises an electronic device manufacturing substrate.

22. The carrying apparatus according to claim 21, wherein the electronic device manufacturing substrate comprises a liquid crystal device substrate.

23. The carrying apparatus according to claim 21, wherein the electronic device manufacturing substrate comprises a quartz device substrate.

24. A transferring apparatus provided adjacent to first and second carrying apparatuses, each carrying apparatus comprising:

a plurality of wafer mounts, each wafer mount having support means for supporting a single wafer, a guide rail for controlling a moving direction of the plurality of wafer mounts, the guide rail being provided adjacent to a plurality of processing apparatuses for processing wafers, the plurality of processing apparatuses being arranged along the moving direction of the plurality of wafer mounts, and a drive unit for moving the plurality of wafer mounts along the guide rail, the transferring apparatus including:

a buffer for temporarily storing wafers;

a first transfer robot for transferring wafers from the plurality of wafer mounts of the first carrying apparatus to the buffer in synchronization with a first drive unit of the first carrying apparatus;

a second transfer robot for transferring wafers from the buffer to the plurality of wafer mounts of the second carrying apparatus in synchronization with a second drive unit of the second carrying apparatus.

25. The transferring apparatus according to claim 24 wherein the first transfer robot transfers to the buffer wafers selected among a plurality of wafers carried by the first carrying apparatus.

26. The transferring apparatus according to claim 24 wherein the first transfer robot transfers to the buffer all wafers carried by the first carrying apparatus.

27. The transferring apparatus according to claim 24 wherein the transferring apparatus is integrated with one of the first and second carrying apparatuses.

28. The transferring apparatus according to claim 24 wherein each of the wafers comprises a semiconductor wafer.

29. The transferring apparatus according to claim 24 wherein each of the wafers comprises an electronic device manufacturing substrate.

30. The transferring apparatus according to claim 29 wherein the electronic device manufacturing substrate comprises a liquid crystal device substrate.

31. The transferring apparatus according to claim 29 wherein the electronic device manufacturing substrate comprises a quartz device substrate.

* * * * *